United States Patent
Shibata et al.

(10) Patent No.: US 6,426,892 B2
(45) Date of Patent: Jul. 30, 2002

(54) NONVOLATILE SEMICONDUCTOR MEMORY DEVICE FOR STORING MULTIVALUED DATA

(75) Inventors: Noboru Shibata; Tomoharu Tanaka, both of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 32 days.

(21) Appl. No.: 09/898,032

(22) Filed: Jul. 5, 2001

Related U.S. Application Data

(63) Continuation of application No. 09/664,546, filed on Sep. 18, 2000, now Pat. No. 6,288,935.

(30) Foreign Application Priority Data

Sep. 20, 1999 (JP) .......................................... 11-266085

(51) Int. Cl.[7] ........................... G11C 16/04; G11C 16/06
(52) U.S. Cl. ............................ 365/185.03; 365/185.21; 365/185.24
(58) Field of Search ...................... 365/185.03, 185.17, 365/185.21, 185.22, 185.24

(56) References Cited

U.S. PATENT DOCUMENTS

| | | | |
|---|---|---|---|
| 5,768,188 A | 6/1998 | Park et al. | 365/185.03 |
| 5,943,260 A | 8/1999 | Hirakawa | 365/185.03 |
| 5,959,882 A | 9/1999 | Yoshida et al. | 365/185.03 |
| 6,128,229 A | 10/2000 | Nobukata | 365/185.22 |
| 6,178,115 B1 | 1/2001 | Shibata et al. | 365/185.03 |
| 6,266,279 B1 * | 7/2001 | Yoshimura | 365/185.24 |
| 6,301,150 B1 * | 10/2001 | Kanamitsu et al. | 365/185.03 |

* cited by examiner

Primary Examiner—Son Mai
(74) Attorney, Agent, or Firm—Banner & Witcoff, Ltd.

(57) ABSTRACT

A multivalued memory has data of state "0", state "1", state "2", and state "3" whose threshold voltages increase in that order. In a first-page write operation, a memory cell whose data is in state "0" is brought into state "1". In a second-page write operation, a memory cell whose data is in state "0" is brought into state "3" and a memory cell whose data is in state "1" is brought into state "2". As a result, in reading the data, the data on the first page can be read in two read operations. Furthermore, the operation of writing the data onto the second page can be made faster, because a high initial write voltage can be used.

6 Claims, 22 Drawing Sheets

| DATA (STATE) IN MEMORY CELL | THRESHOLD VOLTAGE OF MEMORY CELL | DATA TO BE WRITTEN AND READ | |
|---|---|---|---|
| | | 2ND PAGE | 1ST PAGE |
| 0 | 0V OR BELOW | 1 | 1 |
| 1 | 0.3V~0.5V | 1 | 0 |
| 2 | 0.8V~1.0V | 0 | 0 |
| 3 | 1.3V~1.5V | 0 | 1 |

FIG. 2

| DATA (STATE) IN MEMORY CELL | THRESHOLD VOLTAGE OF MEMORY CELL | DATA TO BE WRITTEN AND READ | |
|---|---|---|---|
| | | 2ND PAGE | 1ST PAGE |
| 0 | 0V OR BELOW | 1 | 1 |
| 1 | 0.3V~0.5V | 1 | 0 |
| 2 | 0.8V~1.0V | 0 | 1 |
| 3 | 1.3V~1.5V | 0 | 0 |

FIG. 3

| EXAMPLE OF FIG.3 | NO. OF NECESSARY STEP-UPS | |
|---|---|---|
| 1ST PAGE WRITING | 13 | (0→1)13 |
| 2ND PAGE WRITING | 16 | (0→2)13 (1→3)16 |
| TOTAL | 29 | |

FIG. 6

| PRESENT INVENTION | NO. OF NECESSARY STEP-UPS | |
|---|---|---|
| 1ST PAGE WRITING | 13 | (0→1)13 |
| 2ND PAGE WRITING | 11 | (0→3)11 (1→2)6 |
| TOTAL | 24 | |

FIG. 7

PROGRAM VERIFY (1ST PAGE)

| STATE 0 | STATE 0→1 | | | DATA IN MEMORY CELL | |
|---|---|---|---|---|---|
| inhibit | Write(OK) | Write(NG) | | | |
| A B bit | A B bit | A B bit | | | |
| H L | L H | L L | | LOAD DATA (write→L, inhibit→H IN A) | |
| H L | L H | L L | | READ AT b' | 0→1 |
| H L | L H | L L | | MAKE BIT LINE H WHEN A IS H (VERIFY 1) | Verify |
| H H | H H | L L | | LATCH POTENTIAL ON BIT LINE IN A | |

(inhibit=NO WRITING, Write=WRITING, A=LAT(A), B=LAT(B))

PROGRAM VERIFY (2ND PAGE)

| STATE0 inhibit A B bit | STATE0→3 Write(OK) A B bit | STATE0→3 Write(NG) A B bit | STATE1 inhibit A B bit | STATE1→2 Write(OK) A B bit | STATE1→2 Write(NG) A B bit | DATA IN MEMORY CELL | |
|---|---|---|---|---|---|---|---|
| H L | L | | H | L | L | | |
| H L L | L L L | | H H L | L H H | A B bit | LOAD DATA (write→L, inhibit→H IN A) | LOAD EXTERNAL DATA |
| H L L | L L L | | H H H | L H H | | READ AT a | LOAD INTERNAL DATA |
| | | | | | | LATCH POTENTIAL ON BIT LINE IN B | |

FIG. 17B

| | | | | | | | |
|---|---|---|---|---|---|---|---|
| H L | L L | L/H | H H | L H | L H | | |
| H L L | L L L | L L L | H H L | L H H | L H L | READ AT b' | 1→2 Verify |
| H L L | L L L | | H H L | L H H | L H L | MAKE BIT LINE L WHEN B IS L (VRFY2) | |
| H L H | L L L | | H H H | H H H | L H L | MAKE BIT LINE H WHEN A IS H (VRFY1) | |
| H L H | L L L | | H H H | H H H | L H L | LATCH POTENTIAL ON BIT LINE IN B | |

FIG. 17C

| | | | | | | | |
|---|---|---|---|---|---|---|---|
| H L | L L | | H H | L H | L H | | |
| H L L | L L H | | H H L | L H L | L H L | READ AT b' | 3 Verify |
| H L L | L L H | | H H H | H H H | L H L | MAKE BIT LINE H WHEN A IS H (VRFY1) | |
| H L H | H L H | | H H H | H H H | L H L | LATCH POTENTIAL ON BIT LINE IN A | |

(inhibit=NO WRITING, Write=WRITING, A=LAT(A), B=LAT(B))

FIG. 20

READ (2ND PAGE)

| STATE0, 1 | | STATE2, 3 | | | |
|---|---|---|---|---|---|
| A B | bit | A B | bit | | |
| L L | L | L L | L | READ AT b<br>LATCH POTENTIAL ON BIT LINE IN A | 2ND PAGE READ |

(A=LAT(A), B=LAT(B))

FIG. 21A

READ (1ST PAGE)

| STATE0 | | STATE1, 2 | | STATE3 | | | |
|---|---|---|---|---|---|---|---|
| A B | bit | A B | bit | A B | bit | | |
| L L | L | L L | L | H H | H | READ AT c<br>LATCH POTENTIAL ON BIT LINE IN LAT(A) | 1ST READ |

FIG. 21B

| L L | L | L H | H | H L | H | READ AT a | 2ND READ |
|---|---|---|---|---|---|---|---|
| L L | L | L H | H | H L | L | IF LAT(A) IS H, MAKE BIT LINE L (VRFY1) | |
| L L | L | H H | H | L L | L | LATCH POTENTIAL ON BIT LINE IN A | |

(A=LAT(A), B=LAT(B))

| DATA (STATE) IN MEMORY CELL | THRESHOLD VOLTAGE OF MEMORY CELL | DATA TO BE WRITTEN AND READ | | |
|---|---|---|---|---|
| | | 3RD PAGE | 2ND PAGE | 1ST PAGE |
| 0 | 0V OR BELOW | 1 | 1 | 1 |
| 1 | 0.2V~0.4V | 1 | 1 | 0 |
| 2 | 0.5V~0.7V | 1 | 0 | 0 |
| 3 | 0.8V~1.0V | 1 | 0 | 1 |
| 4 | 1.1V~1.3V | 0 | 0 | 1 |
| 5 | 1.4V~1.6V | 0 | 0 | 0 |
| 6 | 1.7V~1.9V | 0 | 1 | 0 |
| 7 | 2.0V~2.2V | 0 | 1 | 1 |

FIG. 24

NONVOLATILE SEMICONDUCTOR MEMORY DEVICE FOR STORING MULTIVALUED DATA

This application is a Continuation of U.S. application Ser. No. 09/664,546 filed Sep. 18, 2000, U.S. Pat. No. 6,288,935.

CROSS-REFERENCE TO RELATED APPLICATIONS

This application is based upon and claims the benefit of priority from the prior Japanese Patent Application No. 11-266085, filed Sep. 20, 1999, the entire contents of which are incorporated herein by reference.

BACKGROUND OF THE INVENTION

This invention relates to a nonvolatile semiconductor memory device capable of storing, for example, multivalued data.

A NAND flash memory using an EEPROM has been proposed as an electrically rewritable nonvolatile semiconductor memory. In the NAND flash memory, the sources and drains of memory cells arranged side by side are connected in series and the series connection of the memory cells is connected as one unit to a bit line. In the NAND flash memory, all or half of the cells arranged in the direction of row are written into or read from all at once. Recently, a multivalued memory that enables data items to be stored in one cell in a NAND flash memory has been developed.

FIG. 3 shows the relationship between the data in a memory cell in an ordinary multivalued memory and the threshold voltage of the memory cell. The data items in a memory cell, or state "0" to state "3", are defined in ascending order, starting from the lowest threshold voltage of the memory cell. When erasing is done, the data in the memory cell goes to state "0". A write operation causes the threshold voltage of the cell to move to a higher level. When 2-bit data is stored in a single cell, the 2-bit data is separated into first-page data and second-page data. The first-page data and second-page data are switched using an address.

FIG. 4 shows a general method of writing data into a multivalued memory. When data is written into a memory cell, the first-page data is written. Then, the second-page data is written. When the write data constituting the first-page or second-page data is "1", the threshold voltage of the memory cell does not change in the write operation, with the result that the data in the memory cell remains unchanged. Namely, the data is not written. When write data constituting the first-page or second-page data is "0", the threshold voltage of the memory cell is changed in the write operation. As a result, the data in the memory cell is changed, causing the data to be written.

It is assumed that the data in the memory cell in the erased state is in state "0". First, the first-page data is written into the memory cell. When the write data is "1", the data in the memory cell remains in state "0". When the write data is "0", the data in the memory cell goes to state "1".

Next, the second-page data is written. At this time, when write data "0" is externally supplied to the memory cell whose data has become state "1" as a result of the first-page write operation, the data in the memory cell is brought into state "3". Moreover, when data "0" is externally supplied to the memory cell whose data has remained in state "0" as a result of the first-page write operation, the data in the memory cell is brought into state "2".

Furthermore, when data "1" is externally supplied to the memory cell whose data has become state "1" as a result of the first-page write operation, the data in the memory cell is allowed to remain in state "1". In addition, when data "1" is externally supplied to the memory cell whose data has remained in state "0" as a result of the first-page write operation, the data in the memory cell is allowed to remain in state "0".

On the other hand, when the data stored in the memory cell is read, the second-page data is read first and the first-page data is read. With the definition of FIG. 3, when the second-page data is read, if the data in the memory cell is in state "0" or state "1", the read-out data will be "1". Furthermore, if the data in the memory cell is in state "2" or state "3", the read-out data will be "0". For this reason, when the second-page data is read, a judgment can be made through only one operation of judging whether the data in the memory cell is in either state "1" or below or state "2" or above.

In contrast, when the first page data is read, if the data in the memory cell is in state "0" or state "2", the data to be read will be "1". If the data in the memory cell is in state "1" or state "3", the data to be read will be "0". Consequently, the first page requires a total of three read operations for the following judgments: a judgment whether the data in the memory cell is in either state "0" or state "1" or above, a judgment whether the data in the memory cell is in either state "1" or below or state "2" or above, and a judgment whether the data in the memory cell is in either state "2" or below or state "3".

Therefore, an ordinary nonvolatile semiconductor memory device requires many operations in reading the data from the memory cells, taking a long time to read the data.

BRIEF SUMMARY OF THE INVENTION

It is, accordingly, an object of the present invention to overcome the above disadvantage by providing a nonvolatile semiconductor memory device capable of reducing the number of operations in reading data and shortening the data read time.

The foregoing object is accomplished by providing a nonvolatile semiconductor memory device comprising: a memory element which is connected to a bit line and a word line and stores one of state "0", state "1", state "2", and state "3" of data that differ in threshold voltage; a data storage circuit which is connected to the bit line and stores not only data of a first or a second logical level externally supplied but also the data of the first or second level read from the memory element; and a control circuit which controls not only the potential on the bit line and that on the word line but also the operation of the data storage circuit, wherein the control circuit operates in such a manner that in a first operation, the control circuit changes the data in the memory element from the state "0" to state "1" when the data in the data storage circuit is data of the first logical level and keeps the data in the memory element in the state "0" when the data in the data storage circuit is data of the second logical level, that in a first verify operation of verifying whether the data has reached state "1", the control circuit brings the data in the data storage circuit to the second logical level when the data in the data storage circuit is at the first logical level and the data has reached state "1", keeps the data in the data storage circuit at the first logical level when the data has not reached state "1", keeps the data in the data storage circuit at the second logical level when the data in the data storage circuit is at the second logical level, and carries out the first operation until the data in the data storage circuit has reached the second logical level, and that in a second operation, the control circuit changes the data in the memory element from state "1" to state "2" when the data in the data storage circuit is data of the first logical level externally supplied and the data in the memory element is in state "1", and changes the data in the memory element from state "0" to state "3" when the data in the memory element is in state "0".

The foregoing object is further accomplished by providing a nonvolatile semiconductor memory device comprising: a memory element which is connected to a bit line and a word line and stores one of state "0", state "1", state "2", and state "3" of data that differ in threshold voltage; a first storage circuit which is connected to the bit line and stores data of a first or a second logical level externally supplied; a second storage circuit which is connected to the bit line and stores the data of the first or second level read from the memory element; and a control circuit which controls not only the potential on the bit line and that on the word line but also the operation of the first and second storage circuits, wherein the control circuit operates in such a manner that in a first operation, the control circuit changes the data in the memory element from state "0" to state "1" when the data in the first data storage circuit is data of the first logical level and keeps the data in the memory element at the state "0" when the data in the first storage circuit is data of the second logical level, that in a first verify operation of verifying whether the data has reached state "1", the control circuit brings the data in the first storage circuit to the second logical level when the data in the first storage circuit is at the first logical level and the data has reached state "1", keeps the data in the first storage circuit at the first logical level when the data has not reached state "1", keeps the data in the first storage circuit at the second logical level when the data in the first storage circuit is at the second logical level, and carries out the first operation until the data in the first storage circuit has reached the second logical level, that in a second operation, the control circuit stores the data read from the memory element into the second storage circuit, changes the data in the memory element from state "1" to state "2" when the data in the first storage circuit is data of the first logical level externally supplied, changes the data in the memory element from state "0" to state "3" when the data in the memory element is in state "0", and keeps the data in the memory element when the data in the memory element is data of the second logical level, that in a second verify operation of verifying whether the data in the memory element has reached state "2", the control circuit brings the data in the first storage circuit to the second logical level when the data has reached state "2" in a case where the data in the first storage circuit is at the first logical level and the data in the memory element is in state "1" before the second operation is carried out, keeps the data in the first storage circuit at the first logical level when the data has not reached state "2", and brings the potential on the bit line to which the memory element is connected to the first logical level and the data in the first storage circuit to the first logical level when the data in the second storage circuit is at the second logical level in a case where the data in the memory element is in state "0" before the second operation is carried out, and that in a third verify operation of verifying the data has reached state "3", the control circuit brings the data in the first storage circuit to the second logical level when the data in the first storage circuit is at the first logical level and the data has reached state "3", keeps the data in the first storage circuit at the first logical level when the data has not reached state "3", keeps the data in the first storage circuit at the second memory logical level when the data in the first storage circuit is at the second logical level, and carries out the second operation and second and third verify operations until the data in the first storage circuit has reached the second logical level.

The foregoing object is further accomplished by providing a nonvolatile semiconductor memory device comprising: a memory element which is connected to a bit line and a word line and stores one of an n number of data items made up of state "0", state "1", . . . state "n " ($3 \leq n$ where n is a natural number); a data storage circuit which stores data of a first or a second memory logical level externally inputted; and a control circuit which controls not only the potential on the bit line and that on the word line but also the operation of the data storage circuit, wherein the control circuit, in a final write operation, brings state "0" of the smallest data stored in the memory element into state "n" of the largest data.

The foregoing object is further accomplished by providing a nonvolatile semiconductor memory device comprising: a memory element which is connected to a bit line and a word line and stores one of state "0", state "1", state "2", and state "3" of data that differ in threshold voltage; a data storage circuit which is connected to the bit line and stores the data read from the memory element; and a control circuit which controls not only the potential on the bit line and that on the word line but also the operation of the data storage circuit, wherein the control circuit operates in such a manner that in a first read operation, the control circuit sets data of a first logical level in the data storage circuit when the data in the memory element is in either state "0" or state "1", and sets data of a second logical level in the data storage circuit when the data in the memory element is in either state "2" or state "3", and that in a second read operation, the control circuit sets data of the first logical level in the data storage circuit when the data in the memory element is in either state "0" or state "3", and sets data of the second logical level in the data storage circuit when the data in the memory element is in either state "1" or state "2".

With the present invention, the number of operations in reading the data can be reduced, which makes it possible to provide a nonvolatile semiconductor memory device capable of shortening the time required to read the data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 shows the relationship between the data in a four-valued memory cell and the data to be written and read in the first embodiment;

FIG. 3 shows the relationship between the data in a general multivalued memory and the data to be written and read;

FIG. 6 shows the number of writes in the method of FIG. 3;

FIG. 7 shows the number of writes in the present invention;

FIG. 15 is a table to help explain a program verify operation;

FIG. 17A shows the operation in loading the internal data, FIG. 17B shows the operation of the second-page first verify read, and FIG. 17C shows the operation of the second-page second verify read;

FIG. 20 is a table to help explain the operation of the second page read;

FIG. 21A is a table to help explain the first-page first read operation, and FIG. 21B is a table to help explain the first-page second read operation;

FIG. 24 is a table showing the relationship between the data in an eight-valued memory cell and the data to be written and read in a second embodiment of the present invention;

DETAILED DESCRIPTION OF THE INVENTION

Hereinafter, referring to the accompanying drawings, embodiments of the present invention will be explained.
(First Embodiment)

Figure 1:
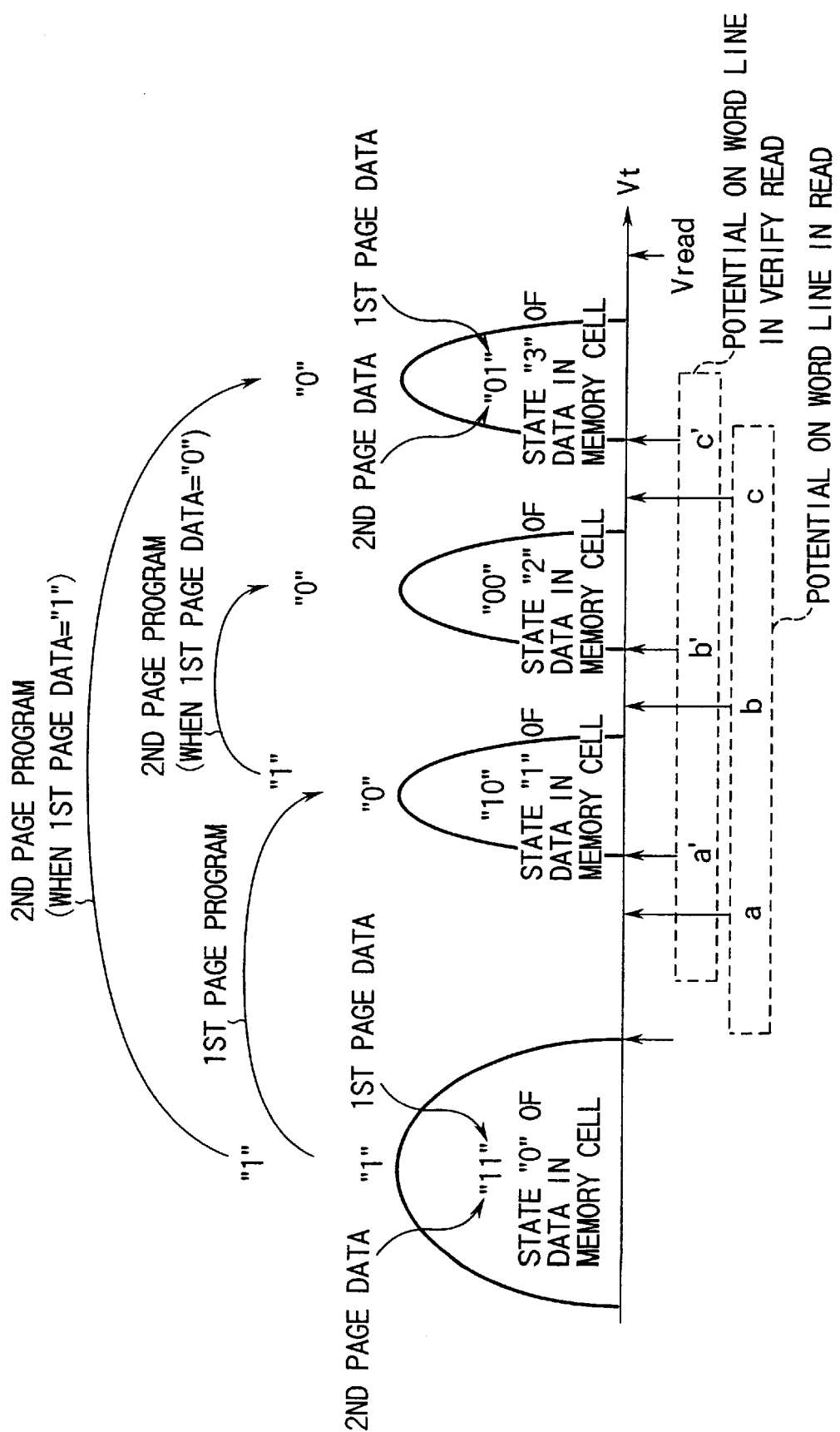
FIG. 1 shows a method of writing four-valued data according to a first embodiment of the present invention.

The principle of a first embodiment of the present invention will be explained. FIGS. 1 and 2 show the relationship between the data in a memory cell and the threshold voltage of the memory cell. The data items in a memory cell, or state "0" to state "3", are defined in ascending order, starting from the lowest threshold voltage of the memory cell. When erasing is done, the data in the memory cell goes to state "0". A write operation causes the threshold voltage of the cell to move to a higher level.

Figure 4:
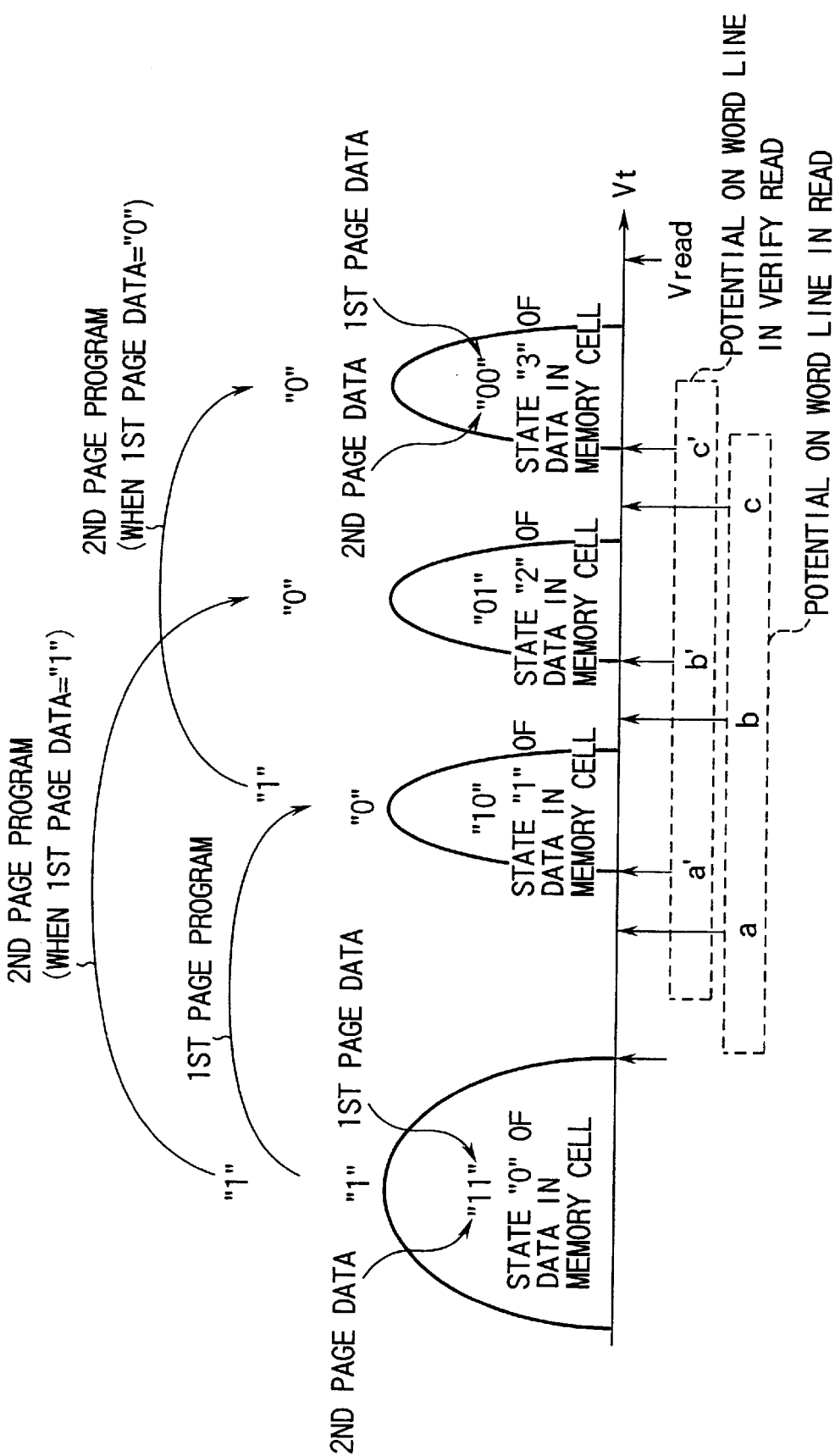
FIG. 4 shows a method of writing data into a general multivalued memory.

As shown in FIGS. 1 and 2, in the memory cell according to the present invention, the data on the first and second pages corresponding to state "2" and state "3" differ from those in FIGS. 3 and 4. Specifically, when the data in the memory cell is in state "2"1, the data on the first and second pages are set to "0", "0". When the data in the memory cell is in state "3", the data on the first and second pages are set to "1", "0". When the data in the memory cell is read, the data on the second page is first read and then the data on the first page is read.

When the data on the second page is read, if the data in the memory cell is in state "0" or state "1", the data to be read will be "1". If the data in the memory cell is in state "2" or state "3", the data to be read will be "0". As a result, the reading of the data on the second page is determined by only one judgment whether the data in the memory cell is in either state "1" of below or state "2", or above as shown in FIGS. 3 and 4.

On the other hand, when the data on the first page is read, if the data in the memory cell is in state "0" or state "3", the data to be read will be "1". If the data in the memory cell is in state "1" or state "2", the data to be read will be "0". As a result, the data on the first page is read on the basis of a judgment whether the data in the memory cell is in either state "0" or state "1" or above and a judgment whether the data in the memory cell is in either state "2" or below or state "3". Namely, the data on the first page can be read by a total of two operations.

As described above, when the data on the first page is read, the reading of data requires only two read operations in the present invention, whereas three read operations are needed to read the data in FIGS. 3 and 4.

FIG. 1 shows a writing method according to the present invention. When data is written into a memory cell, the data on the first page is first written into the memory cell and then the data on the second page is written into the memory cell. If the write data constituting the data on the first page or the second page is "1", a write operation will not change the threshold voltage of the memory cell, with the result that the data in the memory cell will remain unchanged. That is, the data will not be written. If the write data constituting the data on the first page or the second page is "0", a write operation will change the threshold voltage of the memory cell, with the result that the data in the memory cell will change. That is, the data will be written.

In the erased state, the data in the memory cell is in state "0". First, the data on the first page is written into the memory cell. If the write data is "1", the data in the memory cell into which no data is written will remain "0". If the write data is "0", the data in the memory cell into which the data is written will go to state "1".

Next, the data on the second page is written. At this time, if the write operation of the first page causes write data "0" to be supplied to the memory cell whose data is in state "1", the data in the memory cell will be brought into state "2". In addition, if the write operation of the first page causes write data "0" to be supplied to the memory cell whose data is in state "0", the data in the memory cell will be brought into state "3".

Furthermore, if the write operation of the first page causes write data "1" to be externally supplied to the memory cell whose data is in state "1", the data in the memory cell will be allowed to remain in state "1". Moreover, if the write operation of the first page causes write data "1" to be externally supplied to the memory cell whose data is in state "0", the data in the memory cell will be allowed to remain in state "0".

In the case of a multivalued memory, the threshold voltage of the memory cell has to be controlled accurately according to the write data. For this reason, when the data is written into the memory cell, the voltage applied to the control gate of the memory cell is increased gradually, thereby writing the data. This writing method is called a step-up writing method.

Figure 5:
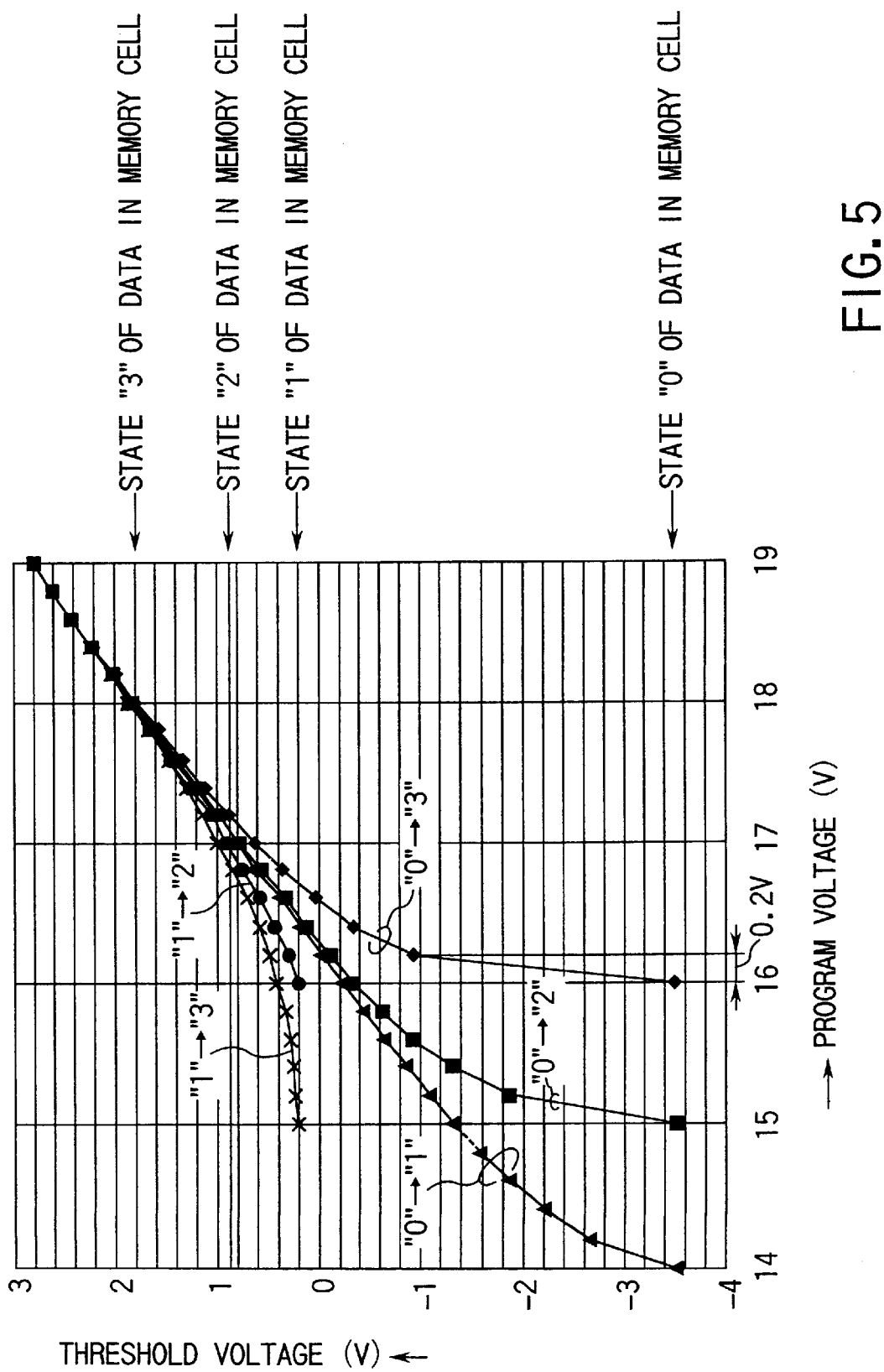
FIG. 5 shows a writing characteristic of a step-up writing method.

FIG. 5 shows a writing characteristic of the step-up writing method for memory cells. The ordinate axis indicates the threshold voltage of a cell and the abscissa axis indicates the write voltage (program voltage).

The threshold voltage of the cell after the data has been erased (the data in the memory cell is in state "0") is assumed to be, for example, −3.5V. As described above, in the present invention, when the data in the memory cell is changed from state "0" to state "3", 16V is applied as an initial program voltage to the control gate of the cell. Thereafter, writing is done by increasing the write voltage in 0.2-V steps, with the result that the threshold voltage increases as represented by "0"→"3" in the figure. On the other hand, when the data in the memory cell is changed from state "0" to "1", the initial write voltage is set to 14V and then writing is started. The reason is that the threshold voltage when the data is in state "1" is 0.2V. Thus, if the initial write voltage were set to 16V and writing started, the threshold voltage would reach the threshold voltage for the data in state "1" between step 3 and step 4, which might result in an overprogram. To avoid this, the initial write voltage is set to 14V.

FIG. 6 shows the number of writes in the general method of FIG. 3. FIG. 7 shows the number of writes in the present invention.

Since the data in the memory cell is moved from state "0" to state "1" in writing data on the first page by both the method of FIG. 3 and the method of the present invention, the data in the memory cell can be set to the threshold voltage of state "1" through 13 writes.

In writing the data on the second page, the method of FIG. 3 requires the data in the memory cell to be moved from state "0" to state "2" or from state "1" to state "3". Therefore, as shown in FIG. 5, the initial write voltage is set to 15V and writing is started. As shown in FIG. 6, the number of writes is 13 when the data in the memory cell is moved from state "0" to state "2", whereas it is 16 when the data in the memory cell is moved from state "1" to state "3". Consequently, up to 16 writes are needed.

In contrast, with the present invention, the data in the memory cell is moved from state "0" to state "3" or from state "1" to state "2". Furthermore, as shown in FIG. 5, in either case where the data is moved from state "0" to "3" or from state "1" to state "2", writing can be effected with an initial write voltage of 16V higher than that in the general method of FIG. 3. For this reason, as shown in FIG. 7, the number of writes is 11 when the data in the memory cell is moved from state "0" to state "3" and it is 6 when the data in the memory cell is moved from state "1" to state "2". As a result, the program can be completed by a maximum of 11 writes, reducing the number of writes as compared with the method of FIG. 3.

(Embodiment)

Figure 8:
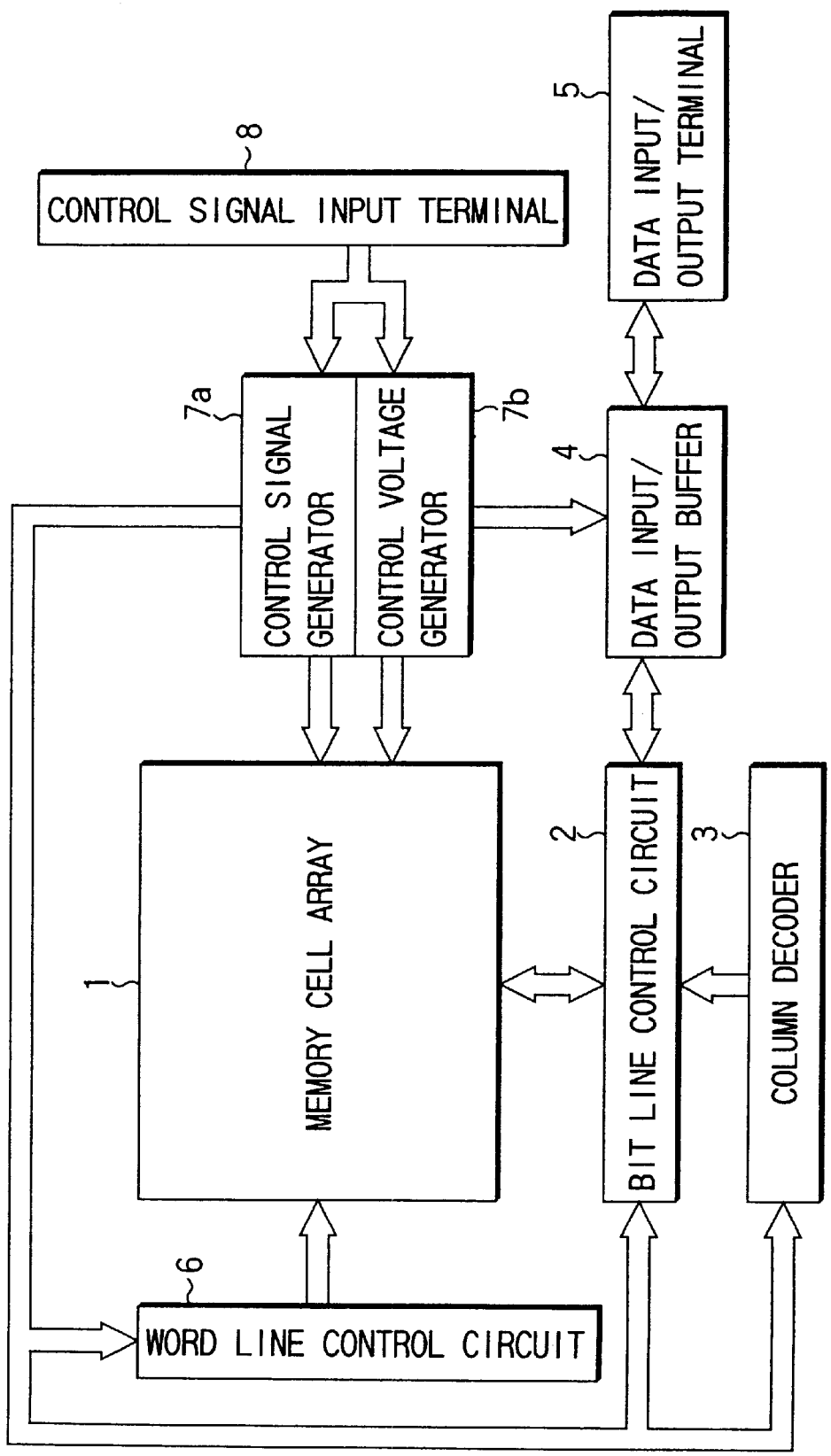
FIG. 8 is a schematic block diagram showing the configuration of a nonvolatile semiconductor memory device according to the present invention.

FIG. 8 schematically shows the configuration of a nonvolatile semiconductor memory device according to the present invention. The nonvolatile semiconductor memory device is, for example, a NAND flash memory for storing four values (2 bits).

A memory cell array 1 includes bit lines, word lines, and common source lines. In the memory cell array 1, electrically rewritable memory cells composed of, for example, EEPROM cells are arranged in a matrix. A bit line control circuit 2 for controlling the bit lines and a word line control circuit 6 are connected to the memory cell array 1.

The bit line control circuit 2 includes data storage circuits as described later and read the data in a memory cell in the memory cell array 1 via a bit line or senses the state of a memory cell in the memory cell array 1 via a bit line. In addition, the bit line control circuit 2 applies a write control voltage to a memory cell in the memory cell array 1 via a bit line, thereby writing the data into the memory cell. A column decoder 3 and a data input/output buffer 4 are connected to the bit line control circuit 2. A data storage circuit in the bit line control circuit 2 is selected by the column decoder 3. The data in the memory cell read into the data storage circuit is outputted via the data input/output buffer 4 at a data input/output terminal to the outside.

The write data externally inputted to the data input/output terminal 5 is inputted via the data input/output buffer 4 to the data storage circuit selected by the column decoder 3.

The word line control circuit 6 is connected to the memory cell array 1. The word line control circuit 6 selects a word line in the memory cell array 1 and applies to the word line the voltage necessary for reading, writing, or erasing.

The memory cell array 1, bit line control circuit 2, column decoder 3, data input/output buffer 4, and word line control circuit 6 are connected to a control signal generator circuit 7a and a control voltage generator circuit 7b and are controlled by the control signal generator circuit 7a and control voltage generator circuit 7b. The control signal generator circuit 7a and control voltage generator circuit 7b are connected to a control signal input terminal 8 and are controlled by a control signal inputted through the control input terminal 8 from the outside. Namely, the control voltage generator circuit 7b generates the voltage necessary to program, verify, read, or erase the data and supplies the voltage to each section of the memory cell array 1.

Figure 9:
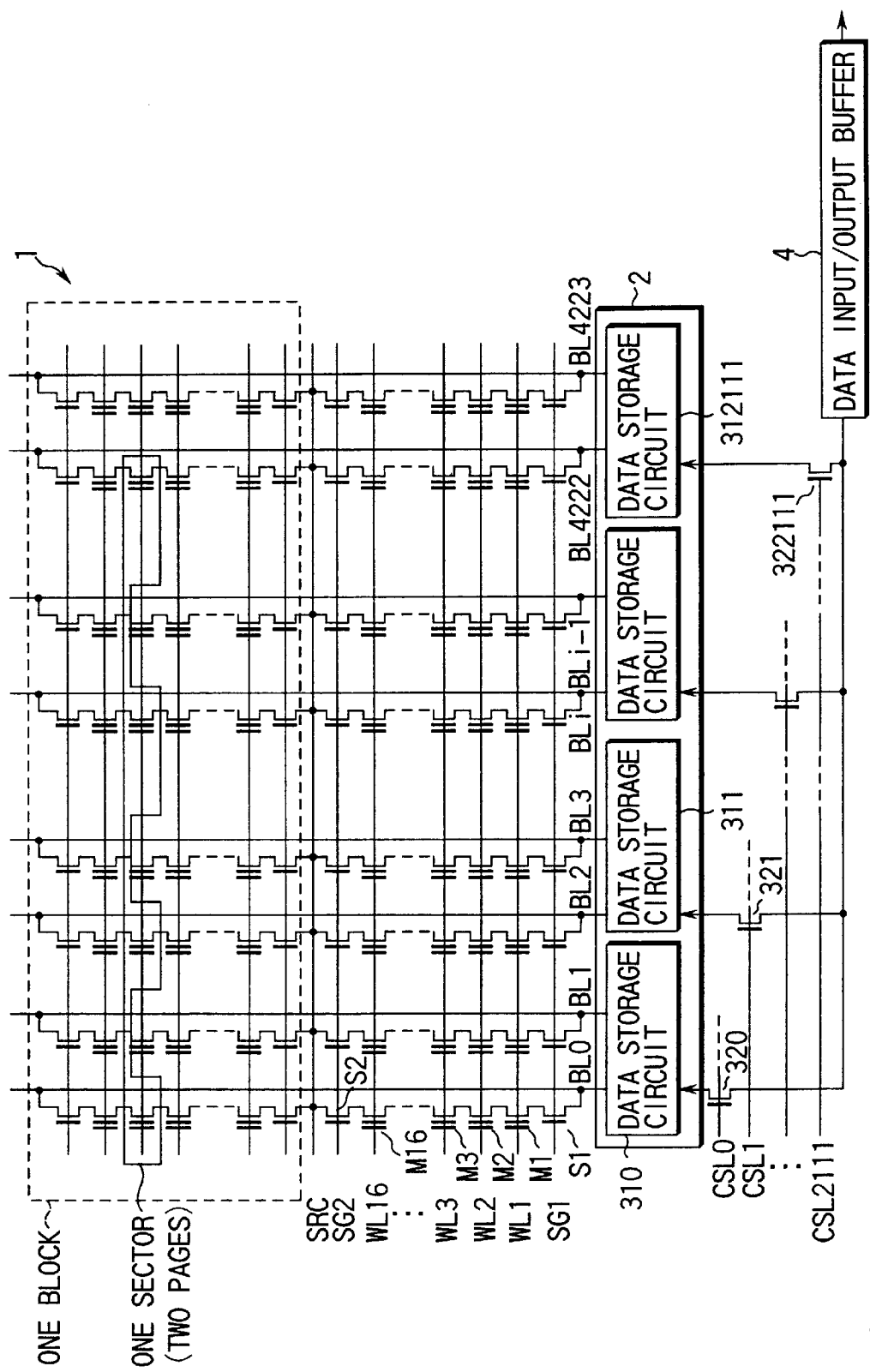
FIG. 9 is a circuit diagram showing the configuration of the memory cell array and bit-line control circuit.

FIG. 9 shows the configuration of the memory cell array 1 and bit line control circuit 2 of FIG. 8. The bit line control circuit 2 includes data storage circuits 310, 311 to 312111. The data storage circuits 310, 311 to 312111 are connected via column select gates 320, 321 to 322111 to the data input/output buffer 4, respectively. These column select gates 320, 321 to 322111 are controlled by column select signals CSL0, CSL1 to CSL2111 supplied from the column decoder 3.

A pair of bit lines is connected to each of the data storage circuits 310, 311 to 312111. Specifically, bit lines BL0, BL1 are connected to the data storage circuit 310, bit lines BL2, BL3 are connected to the data storage circuit 311, and bit lines BL4222, BL4223 are connected to the data storage circuit 312111.

In the memory cell array 1, NAND cells are arranged. A NAND cell is composed of a series connection of, for example, memory cells M1, M2, M3 to M6, or 16 EEPROMs, a select gate Si connected to memory cell M1, and a select gate S2 connected to memory cell M16. The first select gate S1 is connected to bit line BL0 and the second select gate S2 is connected to source line SRC. The control gates of the memory cells M1, M2, M3 to M16 arranged in each row are connected to word line WL1, WL2, WL3 to WL16, respectively. The first select gate S1 is connected to select line SG1 and the second select gate S2 is connected to select line SG2.

A block is composed of 4223 NAND cells. Data is erased in blocks. The memory cells connected to a word line constitute a sector. Data is written and read in sectors. In a sector, for example, two pages of data are stored.

Figures 10A, 10B:
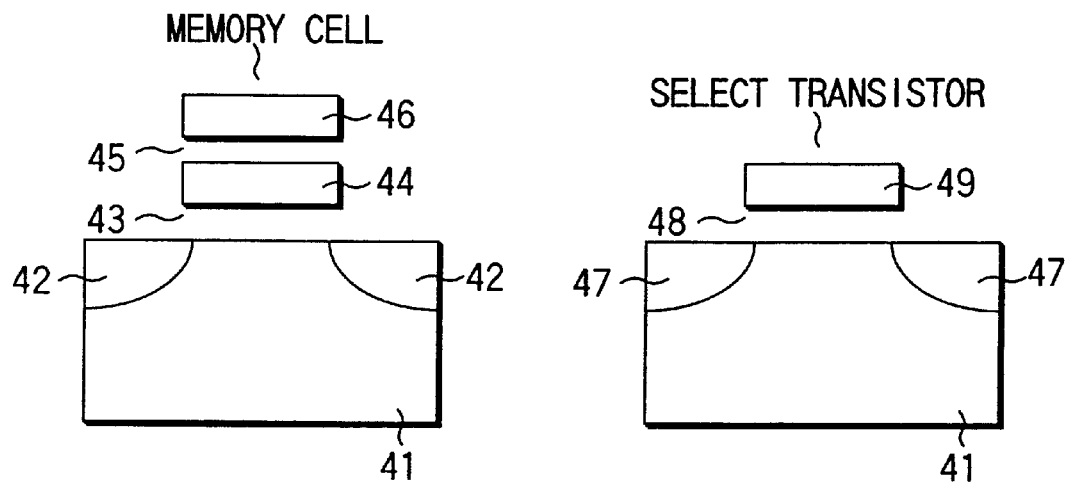
FIGS. 10A and 10B are sectional views of a memory cell and a select transistor.

FIGS. 10A and 10B are sectional views of a memory cell and a select transistor. FIG. 10A shows a memory cell. In a substrate 41, n-type diffused layers 42 serving as the source and drain have been formed. Above the substrate 41, a floating gate 44 has been formed via a gate insulating film 43. Above the floating gate 44, a control gate 46 has been formed via an insulating film 45.

FIG. 10B shows a select transistor. In the substrate 41, n-type diffused layers 47 serving as the source and drain has been formed. Above the substrate 41, a control gate 49 has been formed via a gate insulating film 48.

Figure 11:
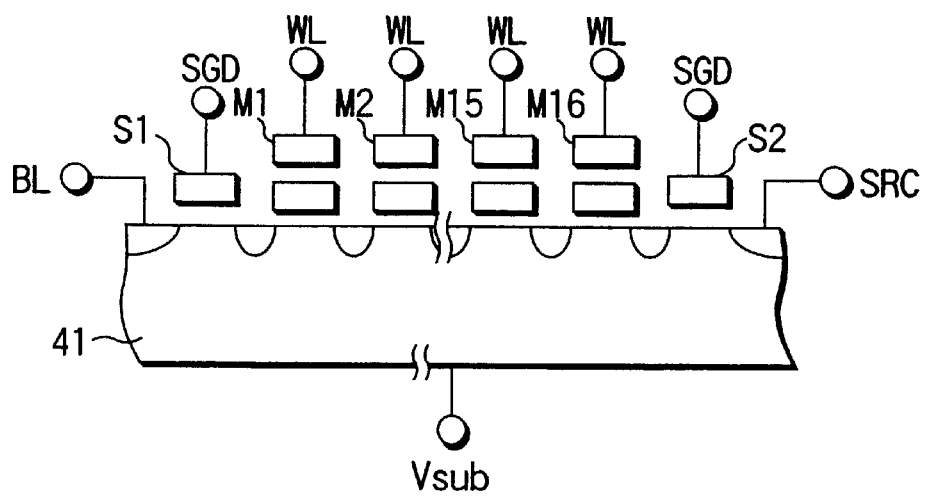
FIG. 11 is a sectional view of a NAND cell in the memory cell array.

FIG. 11 is a sectional view of a NAND cell in the memory cell array. In this example, a NAND cell is composed of a series connection of 16 memory cells M1 to M16 of the configuration shown in FIG. 10A. On the drain side and source side of the NAND cell, there have been provided a first select gate S1 and a second select gate S2 which have the configuration of FIG. 10B.

Figure 12:
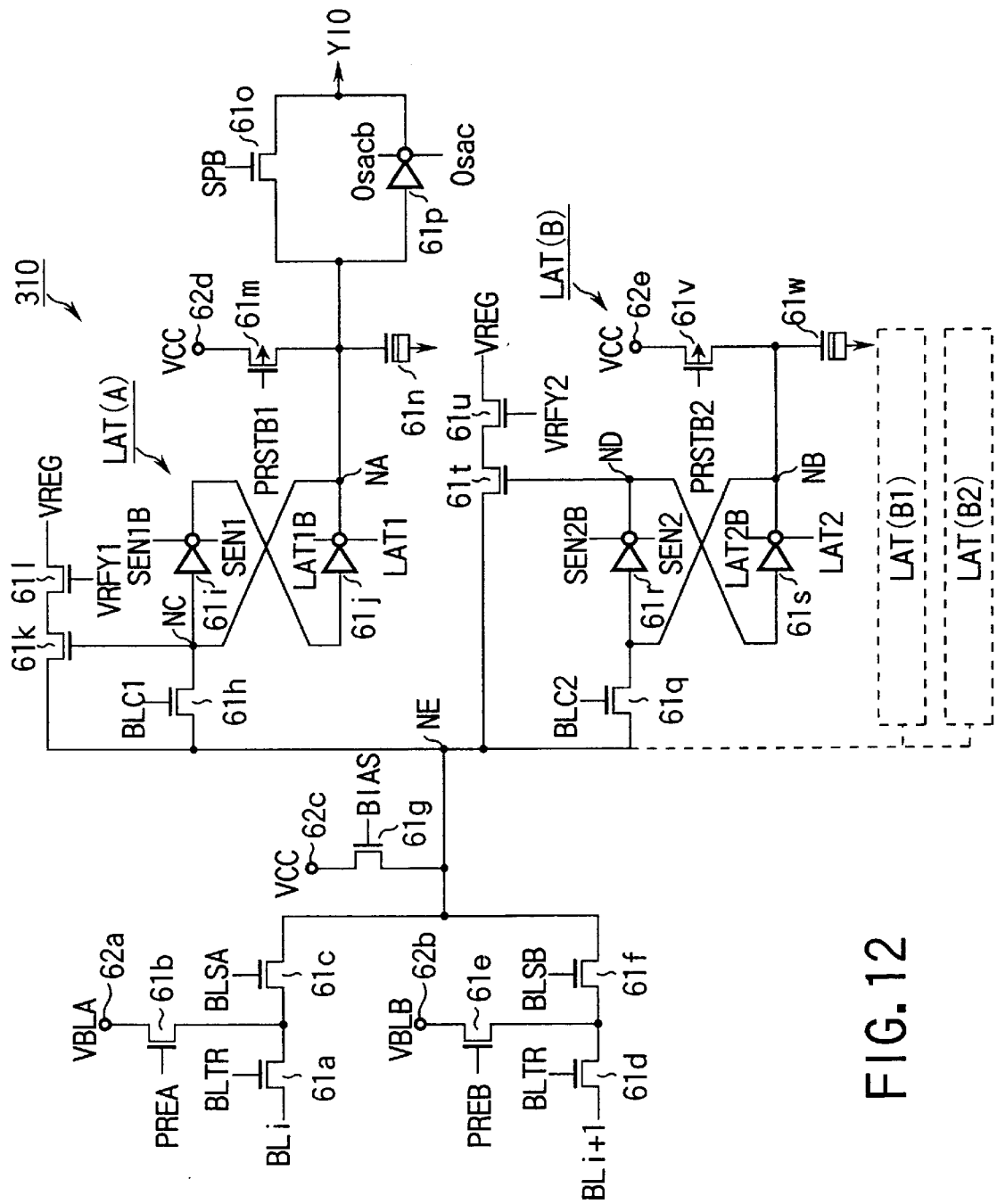
FIG. 12 is a circuit diagram of an example of the data storage circuit shown in FIG. 9.

FIG. 12 shows the data storage circuit 310 of FIG. 9. Since all the data storage circuits have the same configuration, only the data storage circuit 310 will be explained.

One end of the current path of an n-channel transistor 61a is connected to bit line BL1. Signal BLTR is supplied to the gate of the transistor 61a. The other end of the current path of the transistor 61a is connected to one end of the current path of a transistor 61b and one end of the current path of a transistor 61c. The other end of the current path of the transistor 61b is connected to a terminal 62a. Voltage VBLA is supplied to the terminal 62a. Signal PREA is supplied to the gate of the transistor 61b. Signal BLSA is supplied to the gate of the transistor 61c.

One end of the current path of an n-channel transistor 61d is connected to bit line BLl+1. The signal BLTR is supplied to the gate of the transistor 61d. The other end of the current path of the transistor 61d is connected to one end of the current path of a transistor 61e and one end of the current path of a transistor 61f. The other end of the current path of the transistor 61e is connected to a terminal 62b. Voltage VBLB is supplied to the terminal 62b. Signal PREB is supplied to the gate of the transistor 61e. Signal BLSB is supplied to the gate of the transistor 61f. The transistors 61b, 61e precharge the unselected bit lines to the potentials VBLA, VBLB according to the signals PREA, PREB. The transistors 61c, 61f select a bit line according to the signals BLSA, BLSB.

The other ends of the current paths of the transistors 61c, 61f are connected to not only a terminal 62c via a transistor 61g but also a node NE. Signal BIAS is supplied to the gate of the transistor 61g and voltage VCC is supplied to the terminal 62c. The transistor 61g precharges a bit line according to signal BIAS in reading the data.

One end of the current path of a transistor 61h is connected to the node NE. Signal BLC1 is supplied to the gate of the transistor 61h. A first latch circuit LAT(A) is connected to the other end of the current path of the transistor 61h. The first latch circuit LAT(A) is composed of two clocked inverter circuits 61i, 61j. The clocked inverter circuit 61i is controlled by signals SEN1, SEN1B (B indicates the inverted signal). The clocked inverter circuit 61j is controlled by signals LAT1, LAT1B. The first latch circuit LAT(A) latches write data.

Transistors 61k, 61l are connected in series with the node NE. The gate of the transistor 61k is connected to a node NC in the first latch circuit LAT(A). Signal VRFY1 is supplied to the gate of the transistor 61l. Signal VREG is supplied to the current path of the transistor 61l. These transistors 61k, 61l set a potential on the bit line according to the data latched in the first latch circuit LAT(A).

A node NA in the first latch circuit LAT(A) is connected via a p-channel transistor 61m to a terminal 62d. Signal PRSTB1 is supplied to the gate of the transistor 61m and voltage VCC is supplied to the terminal 62d. The transistor 61m sets the node NA of the first latch circuit LAT(A) at the high level in writing or reading the data. The node NA is connected via a capacitor 61n to the ground. The capacitor 61n holds the charge at node NA in reading the data.

The node NA is connected to the column gate (not shown) via a transistor 61o and a clocked inverter circuit 61p connected in parallel. Signal SPB is supplied to the gage of the transistor 61o. The clocked inverter 61p is controlled by signals Osac, Osacb (b indicates the inverted signal). The transistor 61o transfers to the first latch circuit LAT(A) the data supplied via the column select gate in writing the data. The clocked inverter circuit 61p functions as a buffer in reading the data.

On the other hand, one end of the current path of a transistor 61q is connected to the node NE. Signal BLC2 is supplied to the gate of the transistor 61q. A second latch circuit LAT(B) is connected to the other end of the current path of the transistor 61q. The second latch circuit LAT(B) is composed of two clocked inverter circuits 61r, 61s. The clocked inverter circuit 61r is controlled by signals SEN2, SEN2B. The clocked inverter circuit 61s is controlled by signals LAT2, LAT2B. The second latch circuit LAT(B) latches the data read from a cell.

Transistors 61t, 61u are connected in series with the node NE. The gate of the transistor 61t is connected to a node ND in the second latch circuit LAT(B). Signal VRFY2 is supplied to the gate of the transistor 61u. Signal VREG is supplied to the current path of the transistor 61u. These transistors 61t, 61u set a potential on the bit line according to the data latched in the second latch circuit LAT(B).

A node NB in the second latch circuit LAT(B) is connected via a p-channel transistor 61v to a terminal 62e. Signal PRSTB2 is supplied to the gate of the transistor 61v and voltage VCC is supplied to the terminal 62e. The transistor 61v sets the node NB of the second latch circuit LAT(B) at the high level in verify read. The node NB is connected via a capacitor 61w to the ground. The capacitor 61w holds the charge at node NB in verify read.

An explanation of LAT(B1) and LAT(B2) will be given in a second embodiment of the present invention.

The operation of the above configuration will be explained.

As described earlier, the data in the memory cell and the threshold voltage of the memory cell have been defined as shown in FIGS. 1 and 2. The data in the memory cell, or state "0" to state "3", are defined in ascending order, starting from the lowest threshold voltage of the memory cell. In a memory cell, 2-bit data are stored. The 2-bit data are switched using a first-page address and a second-page address outside the nonvolatile semiconductor device.

With the states defined as described above, when the first-page address is specified in reading the data, if the data stored in the memory cell is in state "0" or state "3", the data read out will be "1". If the data stored in the memory cell is in state "1" or state "2", the data read out will be "0". Therefore, the reading of the first page requires a total of two operations or judgments: a judgment whether the data in the memory cell is in state "0" or state "1" or above and a judgment whether the data in the memory cell is in state "2", or below or state "3".

When the second-page address is specified, if the data stored in the memory cell is in state "0" or state "1", the data read out will be "1". If the data stored in the memory cell is in state "2" or state "3", the data read out will be "0". Therefore, the reading of the second page requires only one operation or a judgment whether the data in the memory cell is in either state "1" or below or state "2" or above.

After an erase operation has been carried out, the data in the memory cell goes to state "0".

(Cell Selecting Method)

In a data read operation, a program verify operation and a program operation, one of the two bit lines BLi, BLi+1 (i=0, 1, 2 . . . ) connected to the data storage circuits 310 to 312111 is selected according to an external address supplied from the outside. Furthermore, according to the external address, one word line is selected and two pages (one sector) represented by a solid line in FIG. 9 are selected.

An erase operation is carried out in blocks represented by the dotted lines in FIG. 9. Erasing is done simultaneously on the two bit lines (BLi, BLi+1) connected to each data storage circuit.

An erase verify operation includes two operations. In a first operation, verify reading is done on one (BLi) of the two bit lines (BLi, BLi+1) connected to the data storage circuit. The data read out is stored in the latch circuit LAT(A) of FIG. 12. Then, a verify operation is carried out on the other bit line (BLi+1). The logical add of the read-out data and the result of the preceding verify reading is stored in the first latch circuit LAT(A). The erase verify operation is repeated until the nodes NA of all the first latch circuits LAT(A) go low.

After the erase operation and erase verify operation have been carried out, the data in the memory cell go into state "0". Even when either of the first-page address and second-page address is specified, the data read out is "0". Specifically, because the node NA of the first latch circuit LAT(A) is at the low level, the data read via the clocked inverter circuit 61p is "1".

Program or Program Verify (First-page Program)

Figure 13A:
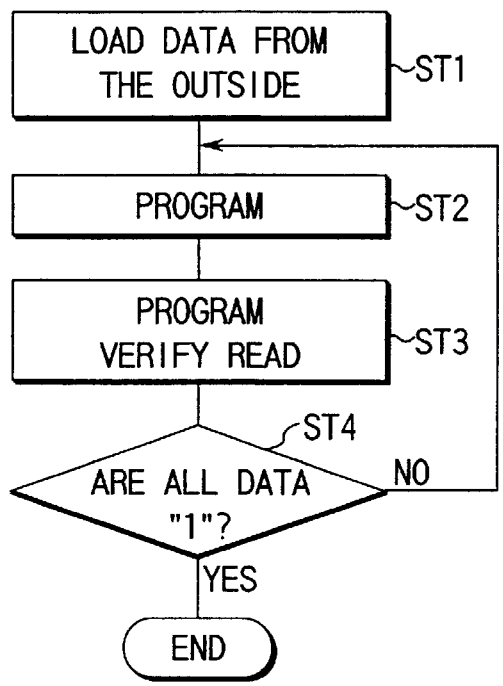
FIG. 13A is a flowchart for the operation of a first-page program and FIG. 13B is a flowchart for the operation of a second-page program.

FIG. 13A shows the operation of the first-page program.

In a program operation, two pages (one sector) of memory cells shown in FIG. 9 are selected according to an external address. In the present embodiment, the program operation can be performed only in this order: the first page and the second page. Thus, using the address, the data on the first page is first selected.

In the first-page program operation, the data on the first page is externally inputted (FIG. 13A, ST1). These data are stored in the first latch circuits LAT(A) (shown in FIG. 12) of the data storage circuits 310 to 312111 shown in FIG. 9. When data "1" (meaning that no writing is done) is inputted from the outside, the node NA of the first latch circuit LAT(A) in FIG. 12 goes high. When data "0" (meaning that writing is done) is inputted, the node NA of the first latch circuit LAT(A) goes low. Thereafter, the data in the first latch circuit LAT(A) is brought to the potential at the node NA of the data storage circuit and the data in the second latch circuit LAT(A) is brought to the potential at the node NB of the data storage circuit.

Figure 14:
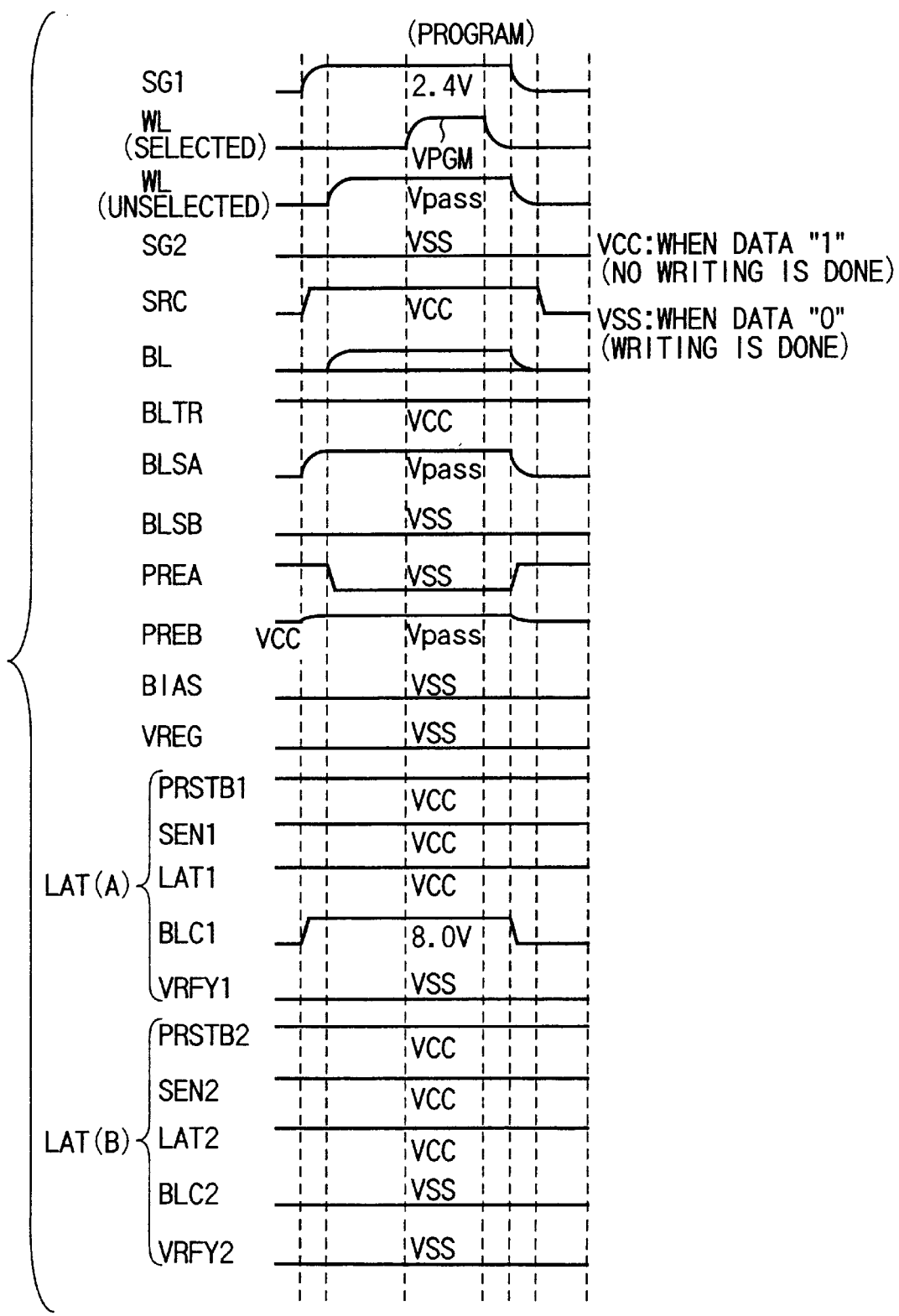
FIG. 14 is a waveform diagram showing the operation sequence in the first-page program.

Then, the program (FIG. 13A, ST2) is executed. FIG. 14 shows the operation sequence for various sections in the first-page program. As shown in FIGS. 12 and 14, if the signal BLC1 supplied to the gate of the transistor 61h is VCC+Vth, signal BLSA is Vpass, and BLTR is VCC, when data "1" (meaning that no writing is done) has been stored in the first latch circuit LAT(A), the potential on the bit line BL is VCC. When data "0" (meaning that writing is done) has been stored, the potential on the bit line is the ground potential VSS. The bit line must not be connected to the selected word line and the cells on the unselected pages (the bit line is unselected) be written into. For this reason, the potential on the bit line connected to the cells is brought to the potential VCC as that on the bit line to which data "1" is supplied.

Here, VCC is applied to the select line SG1 of the selected block, VPGM (20V) is applied to the selected word line, and Vpass (10V) is applied to the unselected word lines. Then, when the bit line is at VSS, the channel of the cell is at VSS and the word line is at VPGM, with the result that electrons are injected into the floating gate of the cell, thereby writing the a data. On the other hand, when the bit line is at VCC, the first select gage S1 is off. This raises VPGM, not VSS, with the result that the channel of the cell is brought to VPGM/2 through coupling. Consequently, the cell is not programmed.

In this way, the data in the memory cell into which data "0" is to be written goes to state "1". The data in the memory cell into which data "1" is written remains in state "0".

(First-page Program Verify Read)

Next, program verify read is executed (FIG. 13A, ST3). FIG. 15 shows the operation of program verify read and FIG. 16 shows the sequence for various section in program verify read.

As shown in FIG. 1, in a first-page program verify read operation, a potential "b'" a little higher than the potential b in reading is supplied to the selected word line. Hereinafter, it is assumed that "'" indicates a verify potential which is slightly higher than the potential on the word line in reading.

Figure 16:
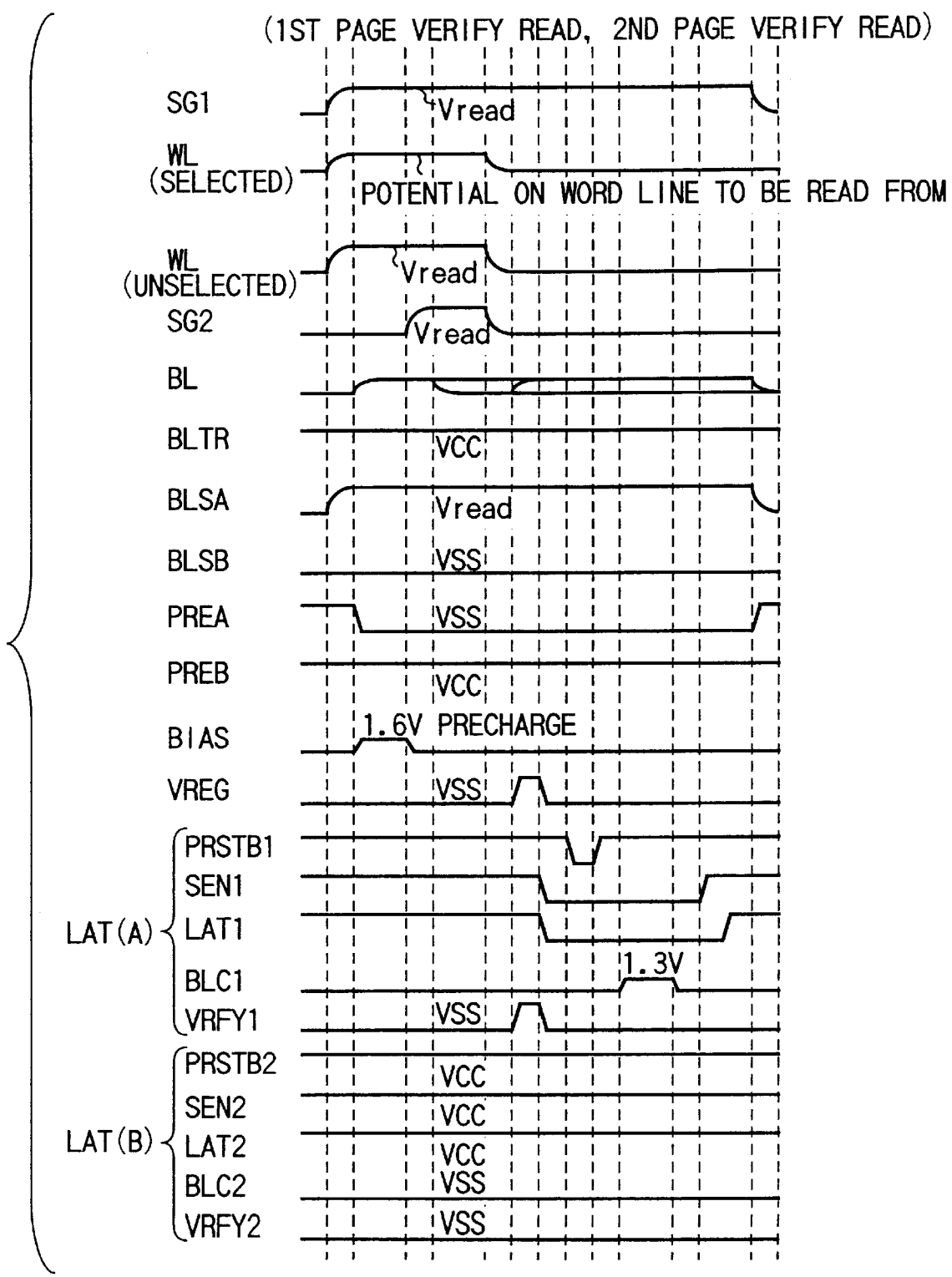
FIG. 16 is a waveform diagram to help explain the operation sequence of the first-page verify read and that of the second-page second verify read.

Next, as shown in FIG. 16, voltage Vread is supplied to the unselected word lines and select lines SG1 in the selected block. Furthermore, signal BIAS supplied to the gate of the transistor 61g in the data storage circuit of FIG. 12 is made high (1.6V), thereby precharging the bit line.

Thereafter, the select line SG2 on the source side of the memory cell is made high (Vread). When the threshold voltage of the memory cell is higher than the voltage "b'", the memory cell is off, with the result that the bit line remains high. When the threshold voltage of the memory cell is lower than the voltage "b'", the memory cell is on, with the result that the potential on the bit line goes low (VSS).

When writing is done, the low level (data "0" ) is latched at the node NA of the latch circuit LAT(A) of FIG. 12. When no writing is done, the high level (data "1") is latched at the node NA. Thus, when signal VREG supplied to the current path of the transistor 61l is brought to VCC and signal VRFY1 supplied to the gate is made high, fixing the bit line from the floating state to the high level only when no writing is done. After this operation, the potential on the bit line is read into the first latch circuit LAT(A). It is when the potential at the memory cell has reached to the threshold voltage or when no writing is done that the high level is latched in the first latch circuit LAT(A). Furthermore, it is only when the potential at the memory cell has not reached the threshold voltage that the low level is latched in the first latch circuit LAT(A).

Therefore, when the first latch circuit LAT(A) is at the low level, the write operation is carried out again and the program operation and verify read operation are repeated until the data in all the data storage circuits have become high (FIG. 13A, ST2 to ST4).

(Second-page Program)

Figure 13B:
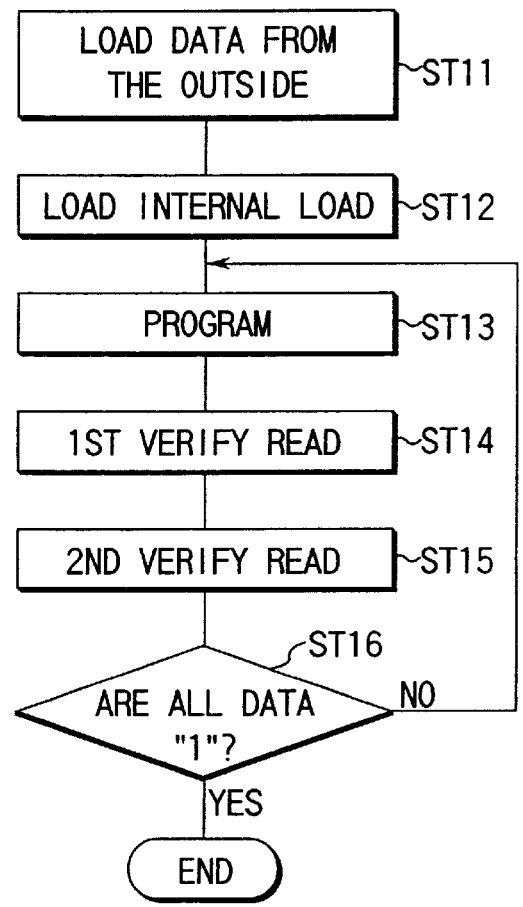

FIG. 13B is a flowchart for the operation of the second-page program.

As in the first-page program, in the second-page program, the data on the second page is inputted from the outside (ST11). These data items are stored in the first latch circuits LAT(A) of the data storage circuits 310 to 312111.

The operation of the second-page program differs greatly from that of the first-page program in internal data load (ST12). The operation of the second-page program varies according to the result of the operation of the first-page program.

Specifically, as shown in FIGS. 1 and 2, in a case where the data in the first-page memory cell is in state "0" (or where no writing has been done), when the data on the second page is "0" (or when writing is done), the data in the memory cell is set to state "3". When the data on the second page is "1" (or when no writing is done), the data in the memory cell is allowed to remain in state "0". In a case where the data in the memory cell is in state "1" (or where the first page has been written into), when the data on the second page is "0" (or when writing is done), the data in the memory cell is set to state "2". When the data on the second page is "1" (or when no writing is done), the data in the memory cell is allowed to remain in state "1".

As described above, the operation of the second-page program varies according to the result of the operation of the first-page program. For this reason, it is necessary to check whether the data in the memory cell is in state "0" or state "1" before writing the data on the second page and store the result of the check. Then, the data in the memory cell is read and loaded into the second latch circuit LAT(B) in the data storage circuit of FIG. 12, which is called an internal data load (ST12). In the internal data load, the potential all of FIG. 1 is supplied to the word line and a read operation is carried out. The result of the reading is stored in the second latch circuit LAT(B) of the data storage circuit.

Figure 18:
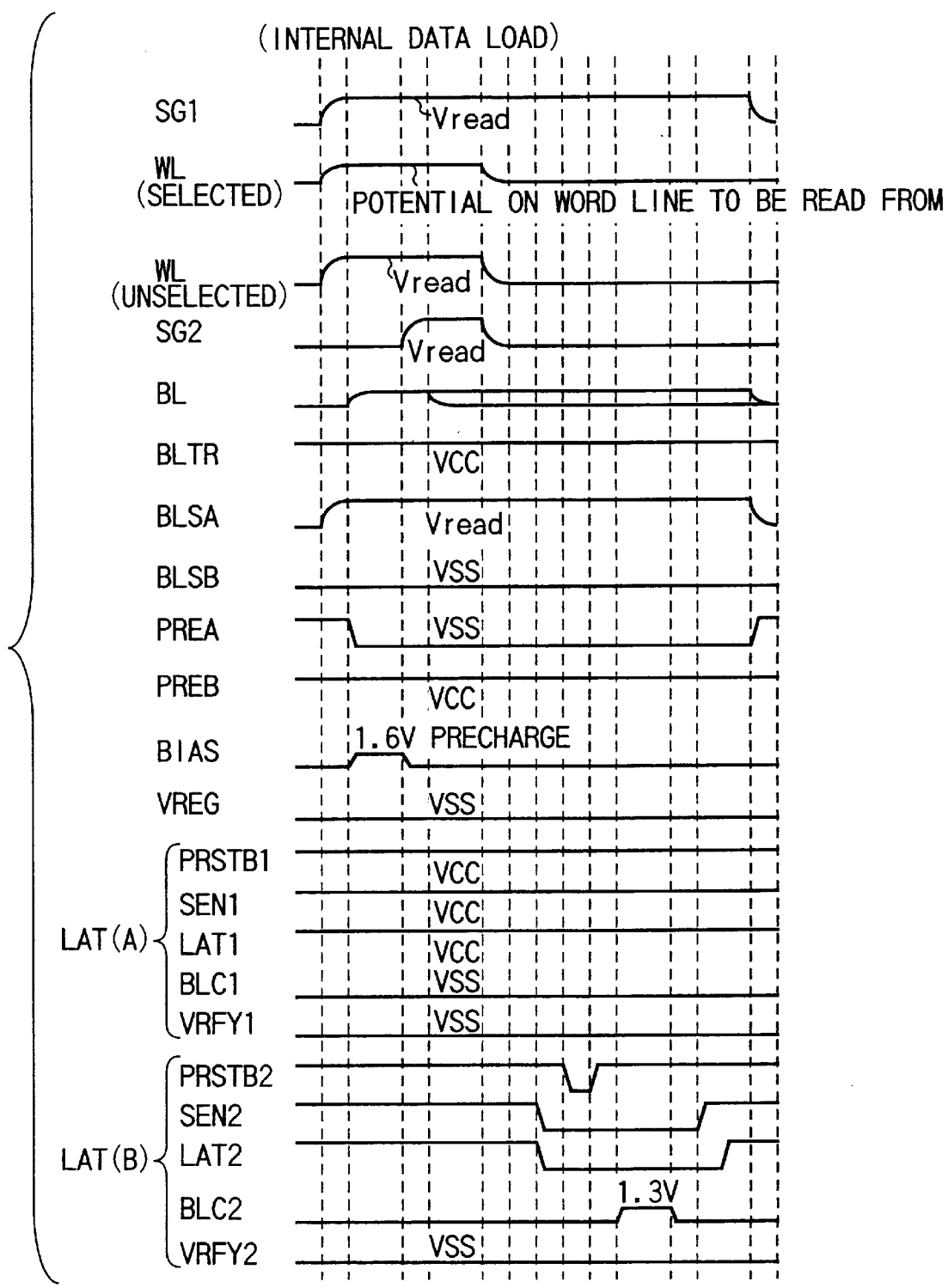
FIG. 18 is a waveform diagram showing the sequence in loading the internal data.

FIG. 17A shows the internal data load operation. FIG. 18 shows the sequence for various sections in the internal data load. The internal data load operation will be explained by reference to FIGS. 17A and 18.

The internal data load operation is almost the same as the first-page verify operation of FIG. 16. While in the first-page verify operation, the data read from the memory cell has been stored in the first latch circuit LAT(A), the data is stored in the second latch circuit LAT(B) in the internal data load. Specifically, the bit line is precharged in the same manner as in the first-page verify operation of FIG. 16 and the data in the memory cell is read onto the bit line. Thereafter, as shown in FIG. 18, the signals PRSTB2, SEN2, LAT2, BLC2, and VRFY2 are activated, thereby storing the potential read onto the bit line into the second latch circuit LAT(B). Namely, signal BLC2 supplied to the gate of the transistor 61q of FIG. 12 is made high as shown in FIG. 18, thereby turning on the transistor 61q. The potential on the bit line is supplied via the transistor 61q to the second latch circuit LAT(B), which then latches the potential.

When the data in the memory cell is in state "0", the memory cell turns on according to the read operation, with the result that the potential on the bit line goes low. This causes the low level to be latched at node NB and the high level to be latched at node ND in the second latch circuit LAT(B). When the data in the memory cell is in state "1", the memory cell turns off, with the result that the potential on the bit line goes high. This causes the high level to be latched at node NB and the low level to be latched at node ND in the second latch circuit LAT(B). The data in the second latch circuit LAT(B) of FIG. 17A indicates node NB.

Next, as in the first-page program, specific voltages are applied to various sections. In this state, all the cells selected are written into according to the data on the second page stored in the first latch circuits LAT(A) (FIG. 13B, ST13).

(Second-page Verify)

A second page verify includes a first verify read (ST14) and a second verify read (ST15). The first verify read (ST14) verifies whether or not the data in the memory cell is in state "2". The second verify read (ST15) verifies whether or not the data in the memory cell is in state "3".

Second-page-First Verify Read

Figure 19:
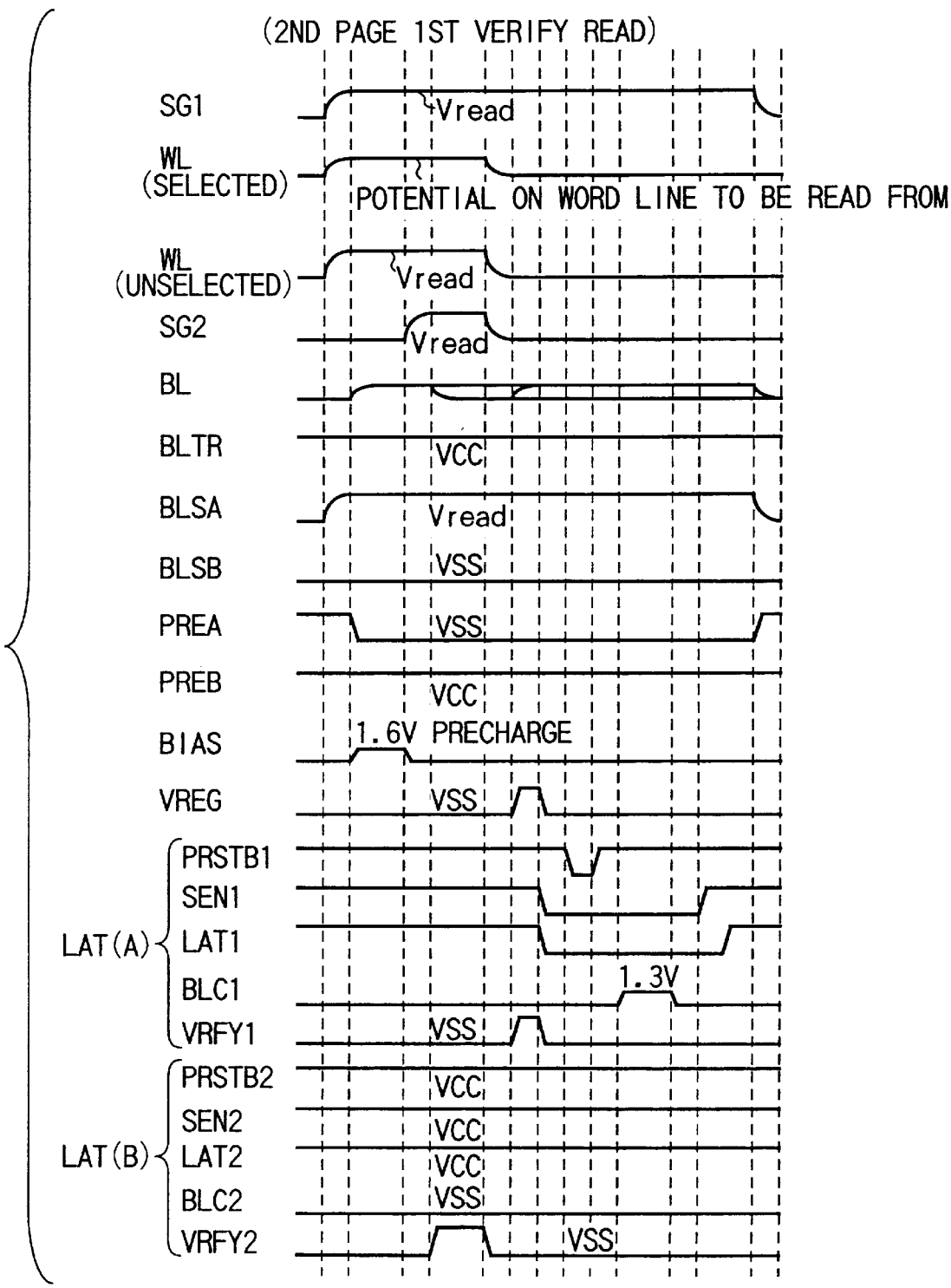
FIG. 19 is a waveform diagram showing the sequence for the second-page first verify read.

FIG. 17B shows the operation of a second-page first verify read. FIG. 19 shows the sequence for various section in a second-page first verify read.

In the verify operation, a read operation is carried out, with the potential "b'" applied to the word line, as shown in FIG. 1. As a result, when the threshold voltage of the, memory cell has reached "b'", the bit line is at the high level. When threshold voltage has not reached "b'", the bit line is at the low level. At this time, the cells that bring the data in the memory cells into state "3", are also turned off. This results in verify OK. Thus, no writing is done in the first-page write operation, making low the potential on the bit lines connected to the memory cells whose data is in state "0".

Specifically, when no writing is done in the first-page write operation and the data in the memory cell is in state "0", the internal data load makes high node ND of the second latch circuit LAT(B). In this state, signal VREG supplied to the current path of the transistor 61u of FIG. 12 is made the ground voltage VSS and signal VREFY supplied to the gate is made high. Then, when node ND of the second latch circuit LAT(B) is at the high level, the transistor 61t is on, forcing the bit line low.

Next, as in the first-page verify operation, signal VREG is made the power-supply voltage VCC and signal VRFY1 supplied to the gate of the transistor 61l is made high. Then, when the high level is latched at node NA of the first latch circuit LAT(A) (or when no writing is done), transistor 61k turns on. As a result, the bit line goes high. After this operation, the potential on the bit line is read into the first latch circuit LAT(A).

As shown in FIG. 17B, it is when the cell being written into to bring the data in the memory cell into state "2" has reached the threshold voltage or when no writing is done that the high level is latched in the first latch circuit LAT(A). Moreover, it is when the cell being written into to bring the data in the memory cell into state "2" has not reached the threshold voltage or when the data in the memory cell being written into is in state "3" that the low level is latched in the first latch circuit LAT(A).

Second-page Second Verify Read

FIG. 17C shows the second-page second verify read operation. FIG. 16 shows the sequence for various section in the second-page second verify read.

This verify is completely the same as the first-page verify operation. It is because there is no cell whose potential is higher than the potential "c'" of FIG. 1 except for the cell which is brought into state "3". In the first-page verify, the potential "a'" has been applied to the word line to verify whether or not the data in the memory cell has reached state "1". In the second-page second verify, however, the potential "c'" is applied to the word line to verify whether or not the data in the memory cell has reached state "3".

As a result, as shown in FIG. 17C, it is when the cell has reached the threshold voltage or when no writing is done (or when the high level has been latched in the first latch circuit LAT(A)) that the high level is latched in the first latch circuit LAT(A). Moreover, it is when the cell has not reached the threshold voltage, that is, when writing is being done to bring the data in the memory cell into state "3" but state "3" has not been reached yet (writing is NG), or when the data in the memory cell is being written to obtain state "2" that the low level is latched in the first latch circuit LAT(A).

Therefore, in the second-page verify, two operations are carried out: a first verify read whereby the data in the memory cell is written to obtain state "2" and a second verify read whereby the data in the memory cell is written to obtain state "3". Moreover, when the first latch circuit LAT(A) is at the low level, writing is done again. In this way, the program operation and verify operation are repeated until the data in all the data storage circuits have become high (FIG. 9, ST13 to ST16).

When the data in the memory cell is in state "3", the threshold voltage is high. This makes it hard to write the data into the memory cell. For this reason, of the repeated program verify operations, the first several verify operations of verifying whether the data in the memory cell is in state "3" can be omitted. For the memory cells into which data in state "2" with the low threshold voltage is written after several repeated operations, writing must have been completed. Consequently, after the program verify operation has been repeated several times, verifying the data in the memory cell which is in state "2" can be omitted.

Read Operation

Figure 22:
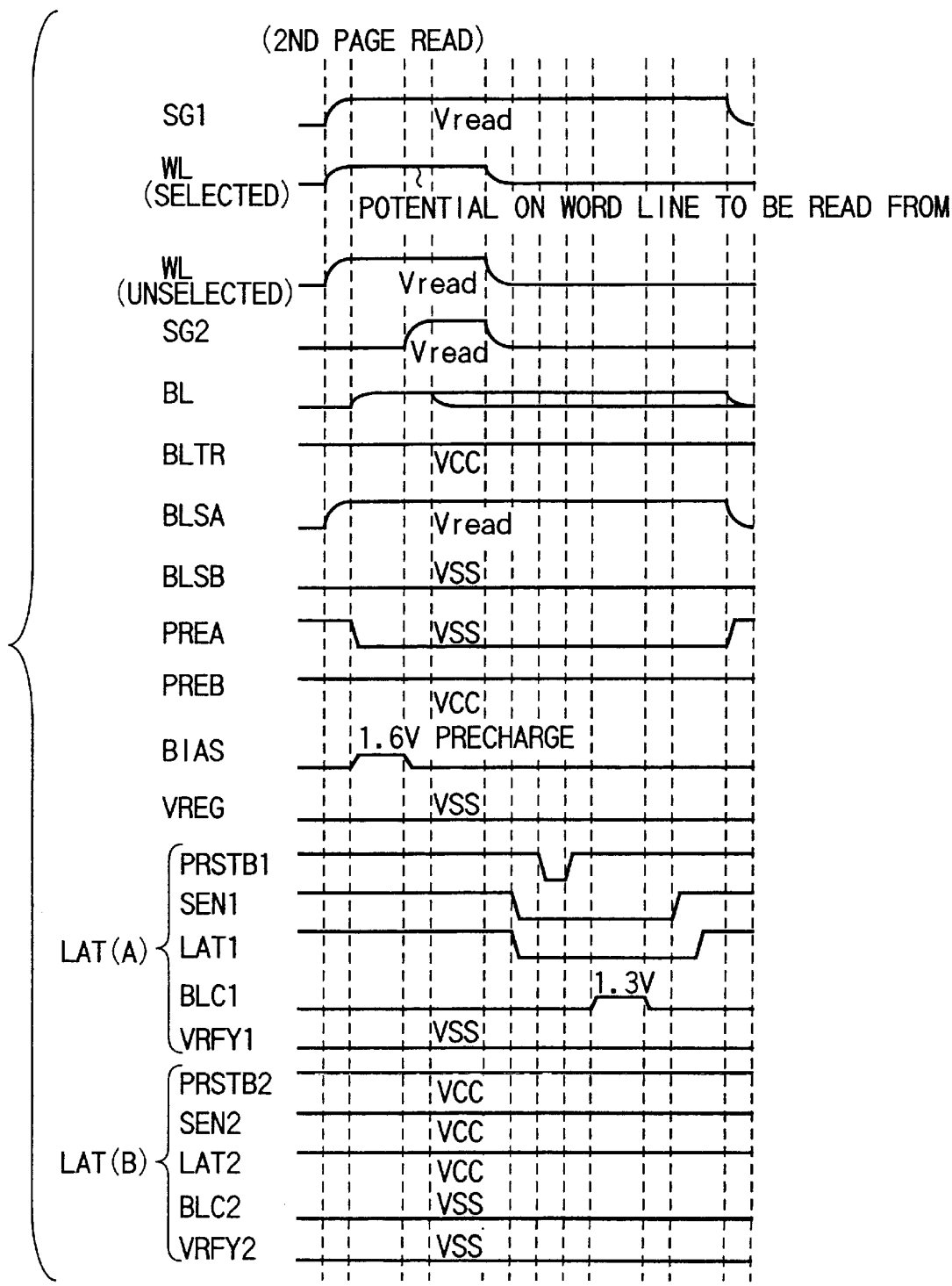
FIG. 22 is a waveform diagram showing the operation sequence for the second page read.

In reading the memory cell, the data on the second page is first read. FIG. 20 shows the operation of reading a second page. FIG. 22 shows the sequence of various sections in reading the second page.
(Second-page Reading)

In the second page read, the potential "c" in reading is applied to the selected word line.

Next, as shown in FIG. 22, Vred (4.5V) is applied to the unselected word lines and the select line SG1 in the selected block. Furthermore, a high-level BIAS is applied to the gate of the transistor 61g of the data storage circuit of FIG. 12, thereby precharging the bit line. Thereafter, the select line SG2 on the source side of the cell is brought to the high level. When the threshold voltage of the cell is higher than the potential c, the cell is off, with the result that the bit line remains high. When the threshold voltage of the cell has not reached the potential c, the cell is on, with the result that the bit line is at the ground potential VSS. The data in the memory cell and the threshold voltage of the memory cell have been defined as shown in FIG. 2. Thus, when the data in the memory cell is in state "0" or state "1", the potential on the bit line is at the low level. When the data in the memory cell is in state "2" or state "3", the potential on the bit line is at the high level.

Next, the potentials on these bit lines are read into the first latch circuits LAT(A). As shown in FIG. 20, node NA of the first latch circuit LAT(A) is at the low level when the data in the memory cell is in state "0" or state "1", and is at the high level when the data in the memory cell is in state "2" or state "3". When the potential at node ND is outputted, the clocked inverter circuit 61p is activated, allowing the potential to pass through the clocked inverter circuit 61p. As a result, data "1" is outputted at the input/output terminal YIO when the data in the memory cell is in state "0" or state "1". Data "0" is outputted at the terminal YIO when the data in the memory cell is in state "2" or state "1".
(First-page Read)

Next, the data on the first page is read. When the data outputted in the first-page read is "1", the data in the memory cell is in state "0" or state "3" as shown in FIG. 2.

Therefore, it is first judged whether the data in the memory cell is in either state "2" or below or state "3". Next, it must be judged whether the data in the memory cell is in either state "0" or state "1" or above.

First Read Operation

Figure 23:
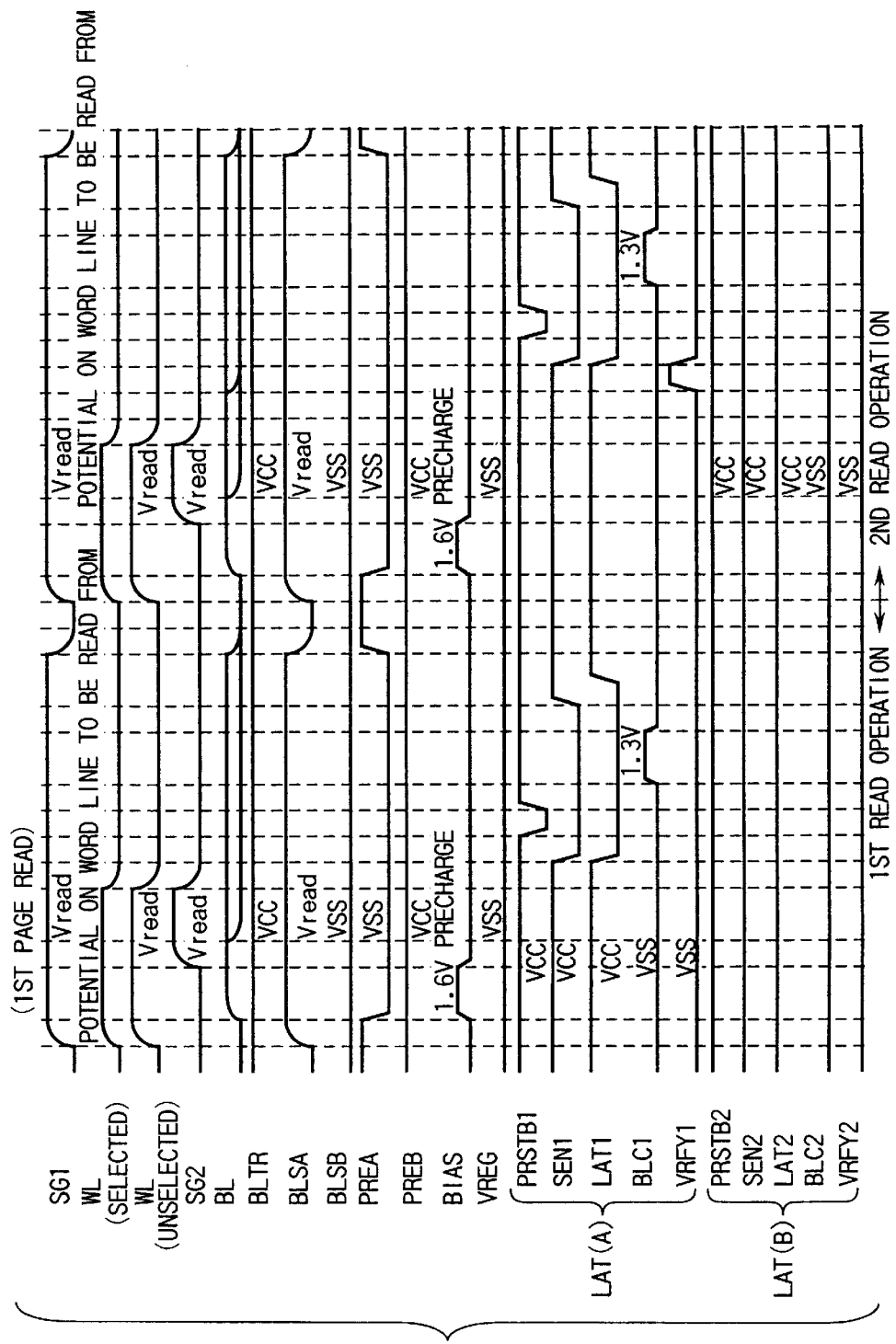
FIG. 23 is a waveform diagram showing the sequence for the first-page first and second read operations.

In the first read operation, it is judged whether the data in the memory cell is in either state "2" or below or state "3". FIG. 21A shows a first-page first read operation. The left half of FIG. 23 shows the sequence for the first-page first read operation. The sequence in FIG. 23 is the same as that in FIG. 22.

First, to check whether the data in the memory cell is in either state "2" or below or state "3", the potential "c" is applied to the word line, thereby reading the data in the memory cell. As a result, it is only when the data in the memory cell is in state "3" that the high level is latched in the first latch circuit LAT(A) as shown in FIG. 21A. Moreover, it is when the data in the memory cell is in any one of state "0", state "1", and state "2" that the low level is latched in the first latch circuit LAT(A).

Second Read Operation

Next, in the second read operation, it is judged whether the data in the memory cell is in either state "0" or state "1" or above. FIG. 21B shows a first-page second read operation. The right half of FIG. 23 shows the sequence for the first-page second read operation.

First, to check whether the data in the memory cell is in either state "0" or state "1" or above, the potential "a" is applied,to the word line, thereby reading the data in the memory cell. As a result, it is only when the data in the memory cell is in state "0" that the low level is latched in the first latch circuit LAT(A). Moreover, it is when the data in the memory cell is in any one of state "1", state "2", and state "3" that the high level is latched in the first latch circuit LAT(A).

Here, signal VREG of FIG. 12 is brought to the ground potential VSS and signal supplied to the gate of the transistor 61l is made high. When the high level has been latched in the first latch circuit LAT(A), or when the data in the memory cell is in state "3" in the first-page first read operation, the bit line is forced low. As a result, when the data in the memory cell is in either state "0" or state "3" , the potential on the bit line is low. When the data in the memory cell is in either state "1" or state "2", the potential on the bit line is high.

Next, when the potentials on these bit lines are read into the first latch circuits LAT(A), if the data in the memory cell is in either state "0" of state "3" as shown in FIG. 21B, node NA of the first latch circuit LAT(A) will go low. If the data in the memory cell is in either state "1" of state "2", node NA will go high. When the potential at node NA is outputted, the clocked inverter circuit 61p is activated, allowing the potential to pass through the clocked inverter circuit 61p. As a result, data "1" is outputted at the input/output terminal YIO when the data in the memory cell is in state "0" or state "3". In addition, data "0" is outputted at the terminal YIO when the data in the memory cell is in state "2" or state "3".

With the first embodiment, a memory cell whose data is in state "0" is brought into state "1" in the first-page write operation, and a memory cell whose data is in state "0" is brought into state "3" and a memory cell whose data is in state "1" is brought into state "2" in the second-page write operation. As a result, in reading the data, the data on the first page is read in only two operations: a first read operation for judging whether the data in the memory cell is in either state "2" or below or state "3" and a second read operation for judging whether the data in the memory cell is in either state "0" or state "1" or above. Consequently, the number of times the first-page is read is decreased.

In the second-page write operation, the data written in the first-page write operation is first latched in the second latch circuit LAT(B). Thereafter, the second-page write operation is carried out. In a verify operation with the data in state "2", the potential on the bit line of the memory cell whose data is in state "0" and is to be written to obtain state "3" is made low on the basis of the data latched in the second latch circuit LAT(B). This prevents the memory cell to be brought into state "3" from having been written into. As a result, the operation of writing data in state "3" into the memory cell into which data in state "0" has been written and the operation of writing data in state "2" into the memory cell into which data in state "1" has been written can be executed simultaneously, enabling a high-speed operation.

Furthermore, in both cases where data in state "3" is written into the memory cell with data in state "0" and where data in state "2" is written into the memory cell with data in state "1", a high initial write voltage can be used, which realizes a high-speed write operation.

In the first embodiment, 4-valued (2-bit) data has been stored. The present invention is not limited to this and may be applied to a case where n-valued (n≧8, 3 bits or more) data is stored.

(Second Embodiment)

Figure 25:
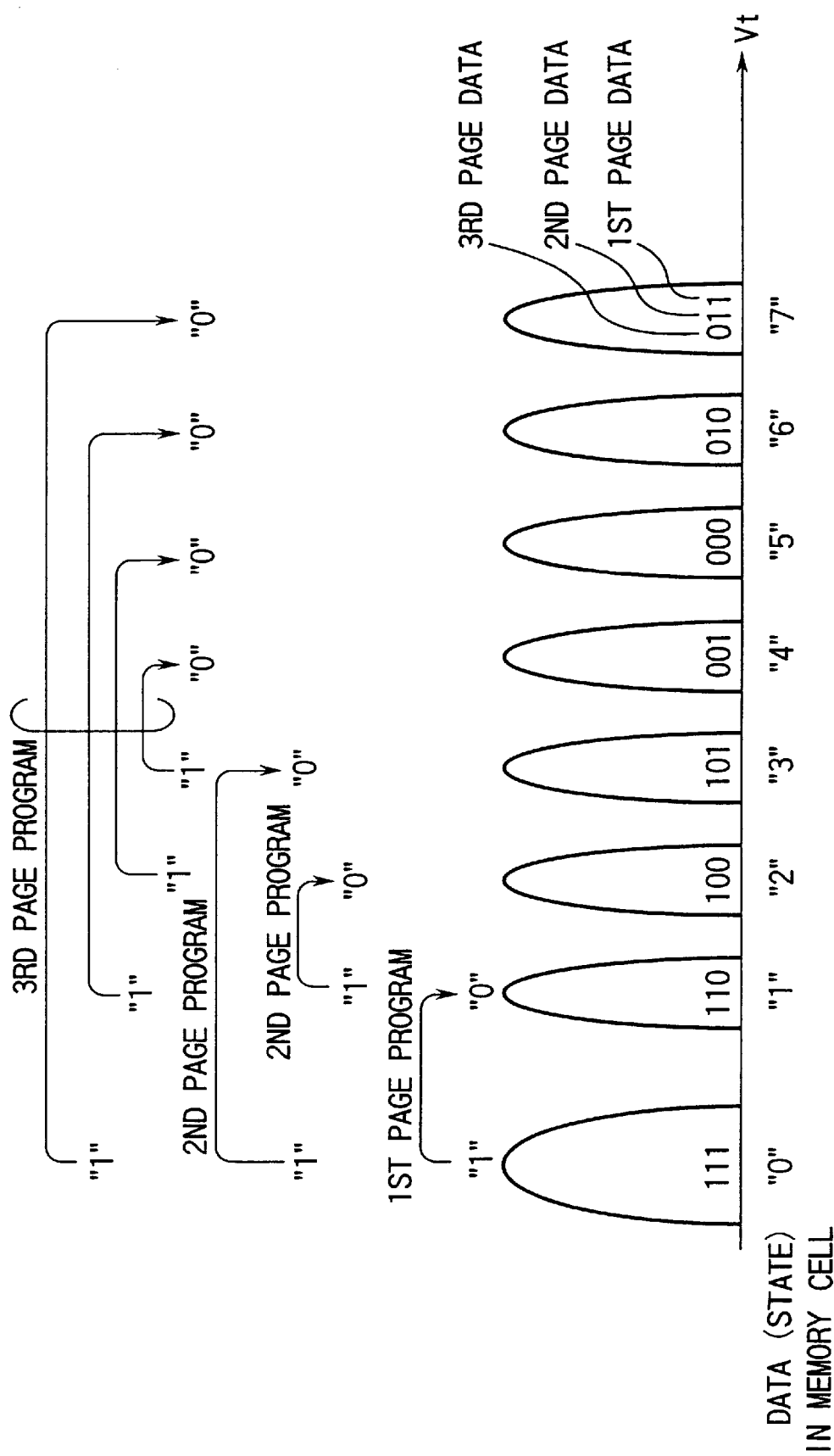
FIG. 25 shows a method of writing eight-valued data in the second embodiment.

FIGS. 24 and 25 show a second embodiment of the present invention, and more particularly a case where eight-valued (3-bit) data is stored.

FIG. 24 shows the data in a memory cell and its threshold voltages and the write data to be written onto and read from a first, a second, and a third page. In a write (program) operation, the data is written onto the first, second, and third pages in that order. A first and a second write operation are completely the same as in the case of four-valued data. By the first-page and second-page write operations, the data in the memory cell is brought into state "0" to state "3". In the first-page, second-page, and third-page write operations, when the write data is "0", the memory cell is written into. When the write data is "1", the memory cell is not be written into. These data items are stored in the first latch circuits LAT(A) of the date storage circuits shown in FIG. 12.

The third-page write operation is carried out as shown in FIG. 25. First, a case where the write data is "1" will be explained. When the data in the memory cell before writing is done is in state "0", the data in the memory cell is allowed to remain in state "0". In addition, when the data in the memory cell before writing is done is in state "1", the data in the memory cell is allowed to remain in state "1". Moreover, when the data in the memory cell before writing is done is in state "2", the data in the memory cell is allowed to remain in state "2". Furthermore, when the data in the memory cell before writing is done is in state "3", the data in the memory cell is allowed to remain in state "3".

In a case where the write data is "0", when the data in the memory cell before writing is done is in state "0", the data in the memory cell is brought into state "7". In addition, when the data in the memory cell before writing is done is in state "1", the data in the memory cell is brought into state "6". Moreover, when the data in the memory cell before writing is done is in state "2", the data in the memory cell is brought into state "5". Furthermore, when the data in the memory cell before writing is done is in state "3", the data in the memory cell is brought into state "4".

Next, the verify operation will be explained. The verify operation is carried out as in the case of four-valued data. Specifically, in an internal data load, the data in the memory cell has been stored in the second latch circuit LAT(B) beforehand. Next, when the result of verifying a memory cell into which data larger than the data in the memory cell to be verified is written has shown verify OK, the data stored in the first latch circuit LAT(A) is kept at write data "0". As a result, the process of writing large data into the memory cell is continued.

With the second embodiment, the third-page program brings the data in the memory cell into state "4", state "5", state "6", and state "7". To store three of these states, that is, state "5", state "6", and state "7", for example, three second latch circuits LAT(B) are provided in the data storage circuits shown in FIG. 12. LAT(B1) and LAT(B2) represented by broken lines indicate second latch circuits. In the internal data load, the state of data in each memory cell is stored in each of the three second latch circuits LAT(B), LAT(B1), and LAT(B2).

In the verify operation of verifying whether or not the data in the memory cell has become state "4", when the data in the memory cell has reached state "4", the result of verifying the cell whose data takes state "5", state "6", or state "7" has also shown OK. As a result, the data in the first latch circuit LAT(A) becomes "1". To avoid this, the data stored in the first latch circuit LAT(A) connected to the memory cell whose data takes state "5", state "6", or state "7" is kept at write data "0" according to the data stored in the second latch circuit LAT(B). Then, the data is changed to data "1" which allows only the first latch circuit LAT(A) connected to the memory cell whose data has been written to obtain state "4", to show verify OK.

Similarly, in the verify operation of verifying whether or not the data in the memory cell has become state "5", when the data in the memory cell has reached state "5", the result of verifying the cell which is being written into to bring the data in the memory cell into state "6" or state "7", has also shown OK. As a result, the data stored in the first latch circuit LAT(A) connected to the memory cell which is being written into to bring the data in the memory cell into state "6" or state "7" is kept at write data "0" according to the data stored in the second latch circuit. Then, the data is changed to data "1" which allows only the first latch circuit LAT(A) connected to the memory cell whose data has been written to obtain state "5" to show verify OK.

Similarly, in the verify operation of verifying whether or not the data in the memory cell has become state "6", when the data in the memory cell has reached state "6", the result of verifying the cell which is being written into to bring the data in the memory cell into state "7" has also shown OK. As a result, the data stored in the first latch circuit LAT(A) connected to the memory cell which is being written into to bring the data in the memory Cell into state "7", is kept at write data "0" according to the data stored in the second latch circuit. Then, the data is changed to data "1" which allows only the first latch circuit LAT(A) connected to the memory cell whose data has been written to obtain state "6" to show verify OK.

In this way, the third-page write operation and verify operation are repeated until the data in all the first latch circuits LAT(A) have become "1".

Next, the read operation will be explained. The data in the memory cell is read from the third page, second page, and first page in that order. The data in the memory cell and the data to be written onto and read from the first, second, and third pages have been defined as shown in FIG. 24. Therefore, in the third-page read operation, if the data in the memory cell is "3" or less, the data read out will be "1". If the data in the memory cell is "4", or more, the data read out will be "0". This enables the data to be read in one read operation.

In the second-page read operation, if the data in the memory cell is either "1" or less or "6" or more, the data read out will be "1". If the data in the memory cell is "2" or more and "5" or less, the data read out will be "0". This enables the data to be read in two read operations.

In the first-page read operation, if the data in the memory cell is "0" or less, or "3" or more and "4" or less, or "7" or more, the data read out will be "1". If the data in the memory cell is "1" or more and "2" or less, or "5" or more and "6" or less, the data read out will be "0". This enables the data to be read in four-read operations.

With the second embodiment, in the third-page write operation, as a result of the first-page and second-page write operations, the memory cell whose data is in state "0" is brought into state "7", the memory cell whose data is in state "1" is brought into state "6", the memory cell whose data is in state "2" is brought into state "5", and the memory cell whose data is in state "3" is brought into state "4". Consequently, the number of read operations on the first page is one, the number of read operations on the second page is two, and the number of read operations on the third page is four. Therefore, the number of reads from the first page is reduced as in the first embodiment.

Furthermore, the write operation that brings a memory cell whose data is in state "0" into state "7", the write operation that brings a memory cell whose data is in state "1" into state "6", the write operation that brings a memory cell whose data is in state "2" into state "5", and the write operation that brings a memory cell whose data is in state "3" into state "4" can be carried out simultaneously. Moreover, in these write operations, a higher initial write voltage than that used in a conventional equivalent can be used, enabling a higher-speed write operation.

(Third Embodiment)

Figure 26:
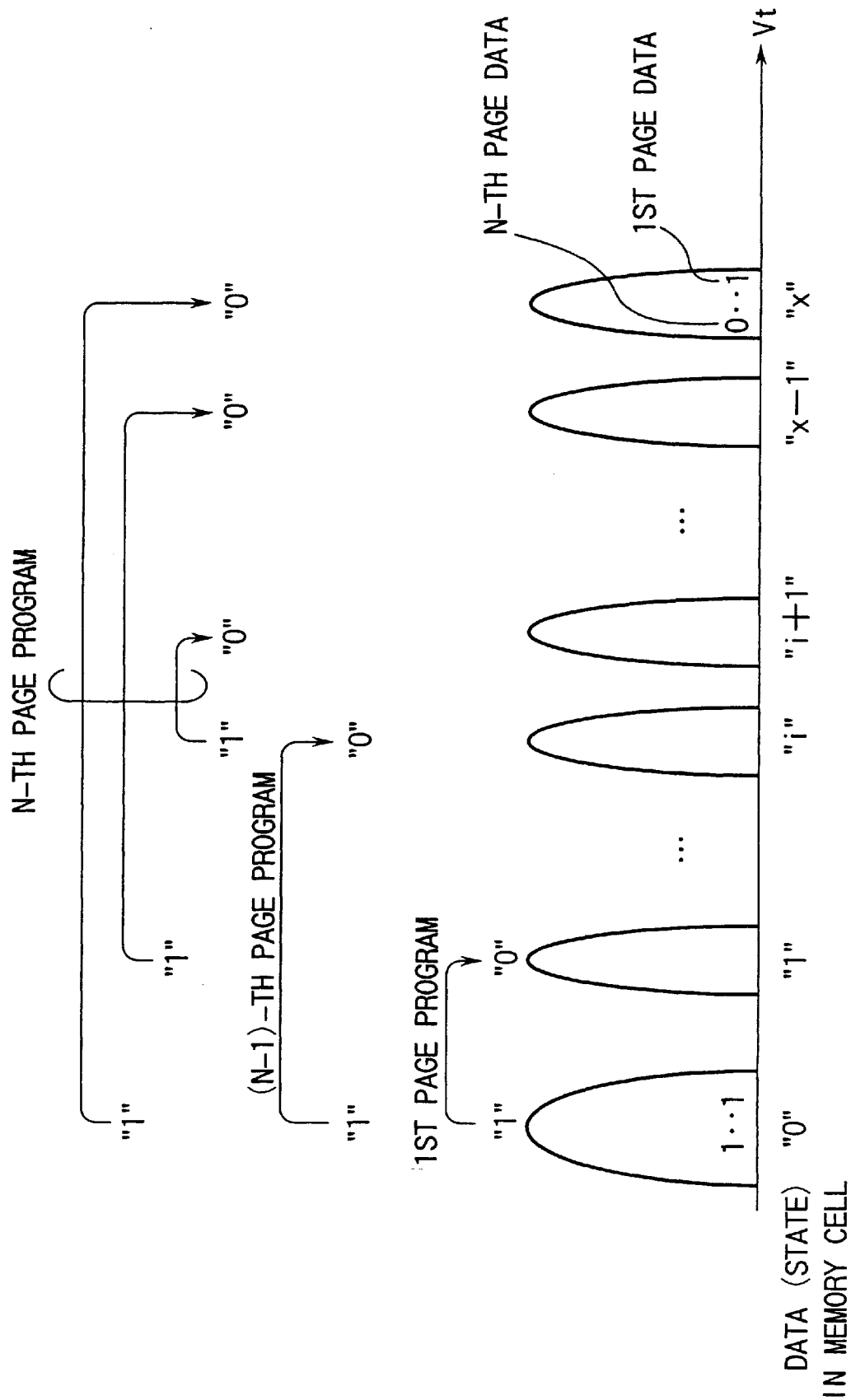
FIG. 26 shows a method of writing n-valued data according to a third embodiment of the present invention.

FIG. 26 schematically shows the operation of an n-valued nonvolatile semiconductor memory device according to a third embodiment of the present invention. In this case too, data is written, starting from the first page, as in the first and second embodiments. Then, when the n-th page is written into, if the write data is "0", a memory cell whose data is in state "0" is brought into, for example, maximum state "x". In addition, a memory cell whose data is in Enstate "1" is brought into state "x-1". From this point on, the. maximum state "i" of the data written in the (n-1)th page write operation is brought into state "i-1".

In the third embodiment, the threshold voltage of the cell has been raised by the program operation and lowered by the erase operation. The present invention is not limited to this. For instance, the present invention may be applied to a nonvolatile semiconductor memory device where the threshold voltage of the cell is lowered by the program operation and raised by the erase operation.

Furthermore, the first and second latch circuits LAT(A) and LAT(B) have been composed of clocked inverter circuits. The present invention is not restricted to this. For instance, the first and second latch circuits LAT(A) and LAT(B) may be composed of capacitors and transistors that control the charging and discharging of the capacitors.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a memory element which is connected to a bit line and a word line and stores one of state "0", state "1", state "2", and state "3" of data that differ in threshold voltage;
    a data storage circuit which is connected to said bit line and stores not only data of a first or a second logical level externally supplied but also data of the first or second level read from said memory element, and
    a control circuit which controls not only the potential on said bit line and that on said word line but also the operation of said data storage circuit, wherein
        said control circuit operates in such a manner that in a first operation, the control circuit changes the data in said memory element from said state "0" to state "1" when the data in said data storage circuit is data of the first logical level and keeps the data in said memory element in said state "0" when the data in said data storage circuit is data of the second logical level, and
        that in a second operation, the control circuit changes the data in said memory element from state "1" to state "2" when the data in said data storage circuit is data of the first logical level externally supplied and the data in said memory element is in state "1", and changes the data in said memory element from state "0" to state "3" when the data in said memory element is in state "0".

2. The nonvolatile semiconductor memory device according to claim 1, wherein said control circuit, in a first verify operation of verifying whether said data has reached state "1", the control circuit brings the data in said data storage circuit to the second logical level when the data in said data storage circuit is at the first logical level and said data has reached state "1", keeps the data in said data storage circuit at the first logical level when said data has not reached state "1", keeps the data in said data storage circuit at the second logical level when the data in said data storage circuit is at the second logical level, and carries out said first operation until the data in said data storage circuit has reached the second logical level,
    said control circuit, in a second verify operation of verifying whether the data in said memory element has reached state "2", brings the data in said data storage circuit to the second logical level when the data has reached state "2" in a case where the data in said data storage circuit is at the first logical level and the data in said memory element is in state "1" before said second operation is carried out, keeps the data in said data storage circuit at the first logical level when the data has not reached state "2", prevents the logical level in said data storage circuit from changing when the data in said memory element is in state "0" before said second operation is carried out, and keeps the data in said data storage circuit at the second logical level when the data in said data storage circuit is at the second logical level, and furthermore said control circuit, in a third verify operation of verifying whether the data in said memory element has reached state "3", brings the data in said data storage circuit to the second logical level when the data in said data storage circuit is at the first logical level and the data has reached state "3", keeps the data in said data storage circuit at the first logical level when the data has not reached state "3", keeps the data in said data storage circuit at the second memory logical level when the data in said data storage circuit is as the second logical level, and carries out said second operation, second and third verify operations until the data in said data storage circuit has reached the second logical level.

3. A nonvolatile semiconductor memory device comprising:

a memory element which is connected to a bit line and a word line and stores one of state "0", state "1", state "2", and state "3" of data that differ in threshold voltage;

a first storage circuit which is connected to said bit line and stores data of a first or a second logical level externally supplied;

a second storage circuit which is connected to said bit line and stores the data of the first or second level read from said memory element; and a control circuit which controls not only the potential on said bit line and that on said word line but also the operation of said first and second storage circuits, wherein said control circuit operates in such a manner that in a first operation, the control circuit changes the data in said memory element from state "0" to state "1" when the data in said first data storage circuit is data of the first logical level and keeps the data in said memory element at said state "0" when the data in said first storage circuit is data of the second logical level, and that in a second operation, the control circuit stores the data read from said memory element into said second storage circuit, changes the data in said memory element from state "1" to state "2" when the data in said first storage circuit is data of the first logical level externally supplied, changes the data in said memory element from state "0" to state "3" when the data in said memory element is in state "0", and keeps the data in said memory element when the data in said first storage circuit is data of the second logical level.

4. The nonvolatile semiconductor memory device according to claim 3, wherein said control circuit, that in a first verify operation of verifying whether said data has reached state "1", the control circuit brings the data in said first storage circuit to the second logical level when the data in said first storage circuit is at the first logical level and said data has reached state "1", keeps the data in said first storage circuit at the first logical level when said data has not reached state "1", keeps the data in said first storage circuit at the second logical level when the data in said first storage circuit is at the second logical level, and carries out said first operation until the data in said first storage circuit has reached the second logical level, that in a second verify operation of verifying whether the data in said memory element has reached state "2", the control circuit brings the data in said first storage circuit to the second logical level when the data has reached state "2" in a case where the data in said first storage circuit is at the first logical level and the data in said memory element is in state "1" before the second operation is carried out, keeps the data in said first storage circuit at the first logical level when said data has not reached state "2", and brings the potential on the bit line to which the memory element is connected to the first logical level and the data in said first storage circuit to the first logical level when the data in said second storage circuit is at the second logical level in a case where the data in said memory element is in state "0" before said second operation is carried out, and that in a third verify operation of verifying said data has reached state "3", the control circuit brings the data in said first storage circuit to the second logical level when the data in said first storage circuit is at the first logical level and said data has reached state "3", keeps the data in said first storage circuit at the first logical level when said data has not reached state "3", keeps the data in said first storage circuit at the second memory logical level when the data in said first storage circuit is at the second logical level, and carries out said second operation and second and third verify operations until the data in said first storage circuit has reached the second logical level.

5. A nonvolatile semiconductor memory device comprising:

a memory element which is connected to a bit line and a word line and stores one of state "0", state "1", state "2", state "3", state "4", state "5", state "6", and state "7" of data that differ in threshold voltage;

a data storage circuit which is connected to said bit line and stores the data read from said memory element; and a control circuit which controls not only the potential on said bit line and that on said word line but also the operation of said data storage circuit, wherein said control circuit operates in such a manner that in a first read operation, the control circuit sets data of a first logical level in said data storage circuit when the data in said memory element is in one of state "0" through state "3", and sets data of a second logical level in said data storage circuit when the data in said memory element is in either state "4" through state "7", that in a second read operation, the control circuit sets data of the first logical level in said data storage circuit when the data in said memory element is in one of state "0", state "1", state "6" and state "7", and sets data of the second logical level in said data storage circuit when the data in said memory element is in one of state "2", state "3", state "4" and state "5", and that in a third read operation, the control circuit sets data-of the first logical level in said data storage circuit when the data in said memory element is in one of state "0", state "t3", state "4" and state "7", and sets data of the second logical level in said data storage circuit when the data in said memory element is in one of state "1", state "2", state "5" and state "6".

6. The nonvolatile semiconductor memory device according to claim 5, wherein in said second read operation, said control circuit sets data of the first logic level in said data storage circuit when said data in said memory element is state "6" or above, sets data of the second logic level in said data storage circuit when said data in said memory element is state "5" or below, keeps data in said data storage circuit when said data in said memory element is state "2" or above, and sets data of the first logic level in said data storage circuit when said data in said memory element is state "1" or below, and in said third read operation, said control circuit sets data of the first logic level in said data storage circuit when said data in said memory element is state "7" or above, sets data of the second logic level in said data storage circuit when said data in said memory element is state "6" or below, keeps data in said data storage circuit when said data in said memory element is state "5" or above, sets data of the first logic level in said data storage circuit when said data in said memory element is state "4" or below, keeps data in said data storage circuit when said data in said memory element is state "3" or above, sets data of the second logic level in said data storage circuit when said data in said memory element is state "2" or below, keeps data in said data storage circuit when said data in said memory element is state "1" or above, and sets data of the first logic level in said data storage circuit when said data in said memory element is state "0" or below.

* * * * *